US009140427B2

(12) United States Patent
Asaki

(10) Patent No.: US 9,140,427 B2
(45) Date of Patent: Sep. 22, 2015

(54) DISPLAY DEVICE WITH CLEARANCE

(71) Applicant: Sony Corporation, Toyko (JP)

(72) Inventor: Reo Asaki, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/538,019

(22) Filed: Nov. 11, 2014

(65) Prior Publication Data

US 2015/0060906 A1 Mar. 5, 2015

Related U.S. Application Data

(63) Continuation of application No. 13/744,036, filed on Jan. 17, 2013, now Pat. No. 8,970,100, which is a continuation of application No. 12/849,912, filed on Aug. 4, 2010, now Pat. No. 8,395,308.

(30) Foreign Application Priority Data

Aug. 18, 2009 (JP) ................. 2009-189445

(51) Int. Cl.
*F21V 9/00* (2015.01)
*H01L 27/32* (2006.01)
*H01L 51/52* (2006.01)

(52) U.S. Cl.
CPC .............. *F21V 9/00* (2013.01); *H01L 27/322* (2013.01); *H01L 27/3211* (2013.01); *H01L 27/3216* (2013.01); *H01L 51/5284* (2013.01); *H01L 27/3206* (2013.01); *H01L 51/5265* (2013.01)

(58) Field of Classification Search
CPC ..... F21V 9/00; H01L 27/3216; H01L 27/322; H01L 27/3211; H01L 27/3206; H01L 51/5284
See application file for complete search history.

(56) References Cited

U.S. PATENT DOCUMENTS

2008/0185958 A1  8/2008  Yoon et al.
2008/0224963 A1* 9/2008  Takagi et al. ................ 345/76
2009/0109358 A1  4/2009  Tanaka et al.
(Continued)

FOREIGN PATENT DOCUMENTS

CN    101267700    9/2008
CN    101424834    5/2009
(Continued)

OTHER PUBLICATIONS

Chinese Office Action issued Oct. 10, 2014, for corresponding Chinese Appln. No. 201203977207.
Chinese Office Action issued Oct. 27, 2014, for corresponding Chinese Appln. No. 2012103982474.

*Primary Examiner* — Anne Hines
(74) *Attorney, Agent, or Firm* — K&L Gates LLP

(57) ABSTRACT

A display device is provided, in which view-angle dependence of chromaticity of white or an intermediate color may be reduced. The display device includes a pair of opposed substrates, a light blocking layer provided on one of the pair of substrates while having a plurality of openings, and a plurality of self-luminous elements provided on the other of the pair of substrates, each of the self-luminous elements having an emission region facing each of the openings, and having an emission color different from an emission color of another element, at least one self-luminous element being different from other self-luminous elements in clearance in a display plane direction from an end of the emission region to an opening of the light blocking film.

7 Claims, 20 Drawing Sheets

(56) References Cited

U.S. PATENT DOCUMENTS

2010/0117528 A1  5/2010  Fukuda
2010/0194268 A1  8/2010  Choi et al.

FOREIGN PATENT DOCUMENTS

| | | |
|---|---|---|
| JP | 2000-228150 | 8/2000 |
| JP | 2006-073219 | 3/2006 |

* cited by examiner

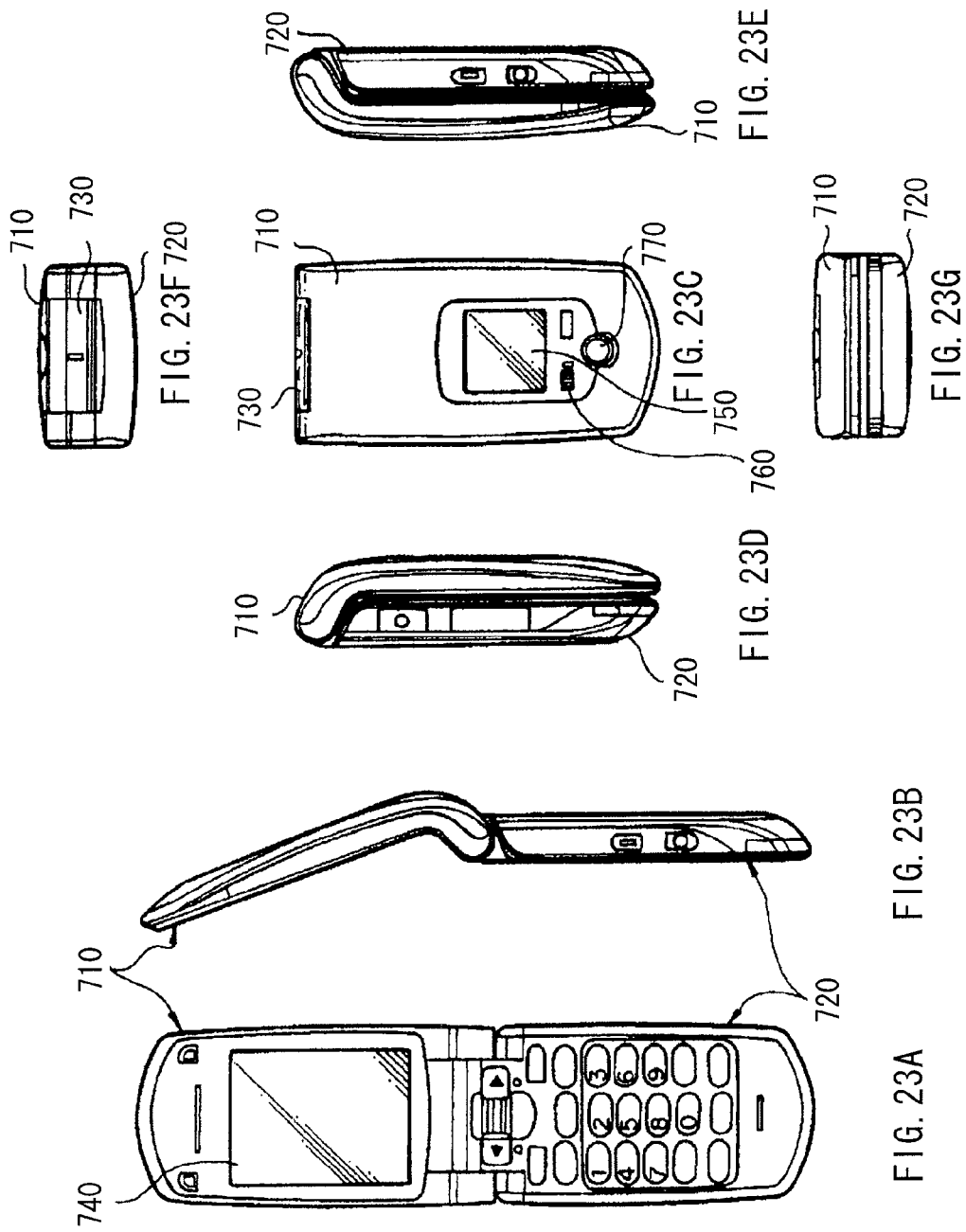

DISPLAY DEVICE WITH CLEARANCE

CROSS REFERENCES TO RELATED APPLICATIONS

This application is a continuation application of, and claims the benefit of and priority to, U.S. patent application Ser. No. 13/744,036, filed Jan. 17, 2013, which is a continuation of U.S. patent application Ser. No. 12/849,912, filed on Aug. 4, 2010, now U.S. Pat. No. 8,395,308, issued Mar. 12, 2013, which claims priority to Japanese Priority Patent Application JP 2009-189445, filed in the Japanese Patent Office on Aug. 18, 2009, the entire contents of each of which are hereby incorporated by reference.

BACKGROUND

The present application relates to a display device having self-luminous elements such as organic EL (Electroluminescence) elements or inorganic EL elements.

In the display device using self-luminous elements such as organic EL elements, the self-luminous elements are provided on one of a pair of substrates, and a light blocking black matrix is provided on the other (for example, see Japanese Patent Application, Publication No. 2006-73219). In such a previous full-color display device, white or an intermediate color is displayed by mixing colors of emission light from monochromatic self-luminous elements.

SUMMARY

However, such a previous display device has had a difficulty that when a view angle characteristic is varied between colors, white balance is disrupted, and therefore chromaticity of white or and intermediate color is changed depending on view angles. A major cause of difference in view angle characteristic between colors includes use of a resonator effect or an interference effect for improving light extraction efficiency, or a dimension of an emission region varied between colors for compensating disruption of luminance balance due to aging.

It is desired to provide a display device in which view-angle dependence of chromaticity of white or an intermediate color may be reduced.

A display device according to an embodiment has the following components (A) to (C):

(A) a pair of opposed substrates;
(B) a light blocking film provided on one of the pair of substrates while having a plurality of openings; and
(C) a plurality of self-luminous elements provided on the other of the pair of substrates, each element having an emission region facing each of the openings, and having an emission color different from that of another element, where at least one element is different from other elements in clearance in a display plane direction from an end of the emission region to an opening of the light blocking film.

In the display device according to the embodiment, the plurality of self-luminous elements emit monochromatic light different in color from one another, and white or an intermediate color is displayed by mixing colors of the monochromatic light.

In such a case, when the plurality of self-luminous elements are viewed in an oblique direction, a shadow portion is formed by the light blocking film. If the shadow portion overlaps with an emission region of a self-luminous element, such an overlapped portion becomes a light blocked region where emitted light is shaded by the light blocking film, and luminance is thus decreased in accordance with area of the light blocked region.

In the display device, since at least one self-luminous element is different in clearance from another element in a display plane direction from an end of the emission region to an opening of the light blocking film, the self-luminous element is different in ratio of light blocking area to emission region area from other self-luminous elements, and thus different from other elements in level of luminance reduction due to light blocking of the light blocking film. In this way, a level of luminance reduction due to light blocking of the light blocking film is varied between colors. Thus, when difference in view angle characteristic exists between colors, such difference may be reduced, and consequently change in chromaticity depending on view angles of white or an intermediate color may be suppressed.

In the display device according to the embodiment, since at least one self-luminous element is made different from another self-luminous element in clearance in a display plane direction from an end of the emission region to an opening of the light blocking film, difference in view angle characteristic between colors is reduced by using reduction in luminance due to light blocking of the light blocking film, and consequently view-angle dependence of chromaticity of white or an intermediate color may be reduced.

Additional features and advantages are described herein, and will be apparent from the following Detailed Description and the figures.

BRIEF DESCRIPTION OF THE FIGURES

FIG. 20A shows appearance of application example 2 as viewed from a front side, and FIG. 20B shows appearance thereof as viewed from a back side.

FIGS. 23A to 23G are views, where FIG. 23A is a front view of application example 5 in an opened state, FIG. 23B is a side view thereof, FIG. 23C is a front view thereof in a closed state, FIG. 23D is a left-side view thereof, FIG. 23E is a right-side view thereof, FIG. 23F is a top view thereof, and FIG. 23F is a bottom view thereof.

DETAILED DESCRIPTION

The present application will be described in detail with reference to drawings according to an embodiment. Description is made in the following sequence.

1. Embodiment (1) Description of the principle (example where width of emission regions are the same between all colors, and a blue clearance is large compared with that for another color)
(2) Calculation example 1 (example where width of emission regions are the same between all colors, and a blue clearance is small compared with that for another color)
(3) Calculation example 2 (example where width of a blue emission region is large compared with width of another color emission region, and a blue clearance is small compared with that for another color)

2. Modification 1 (Example where a Clearance is Continuously Changed within One Self-Luminous Element)

3. Application Examples

Figure 1:
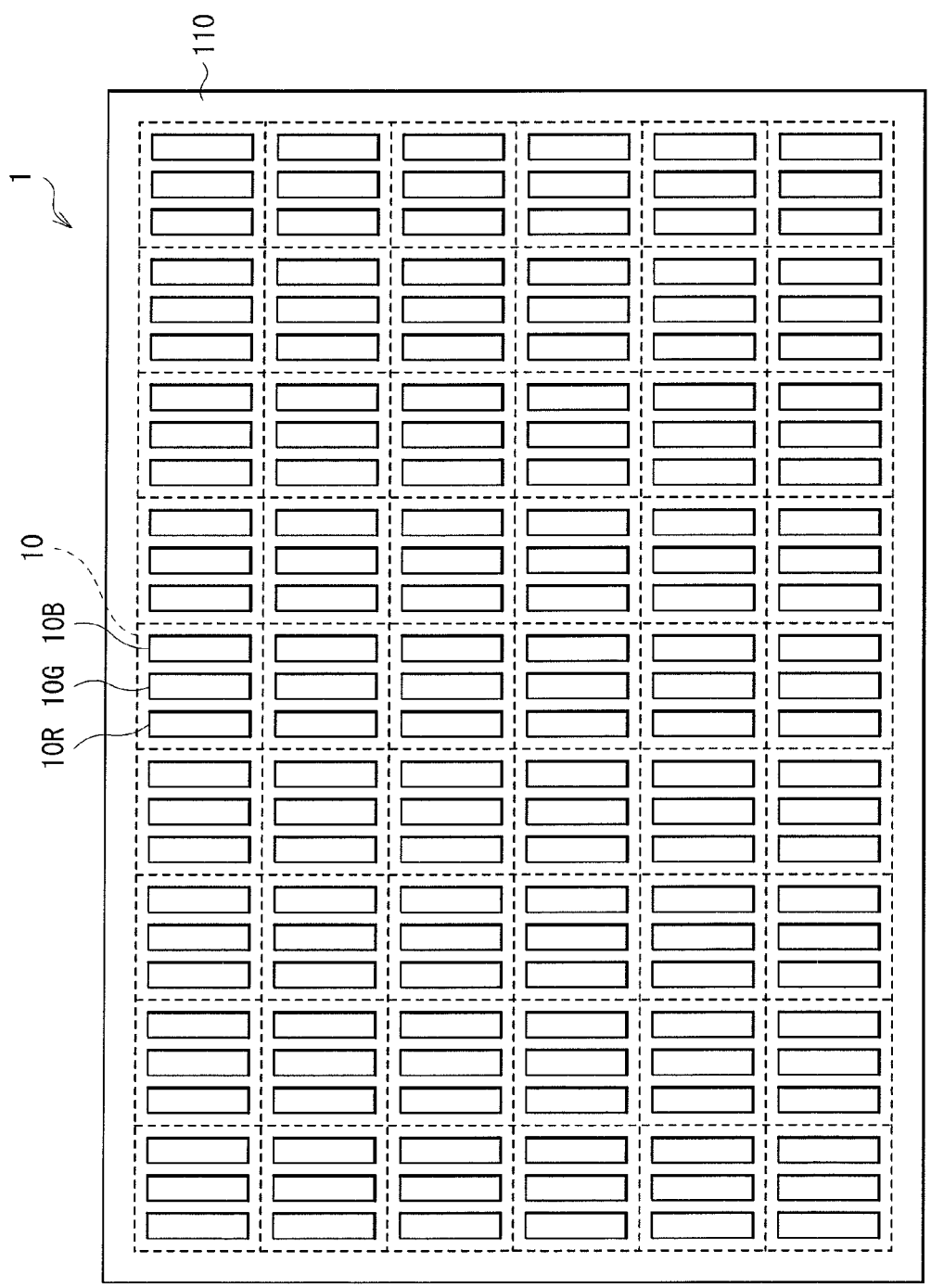
FIG. 1 is a plan view showing a configuration of a display device according to a first embodiment.

FIG. 1 shows an example of a planar configuration of a display device according to an embodiment. The display device 1 is used for a television apparatus or the like, and has a configuration where a plurality of pixels 10 are arranged, for example, in a matrix in a display region 110. Each pixel 10 has, for example, a self-luminous element 10R emitting red monochromatic-light, a self-luminous element 10G emitting green monochromatic-light, and a self-luminous element 10B emitting blue monochromatic-light. Each of the self-luminous elements 10R, 10G and 10B may be configured of not only an organic EL element described later, but also an inorganic EL element, a semiconductor laser, or an LED (Light Emitting Diode).

Figure 2:
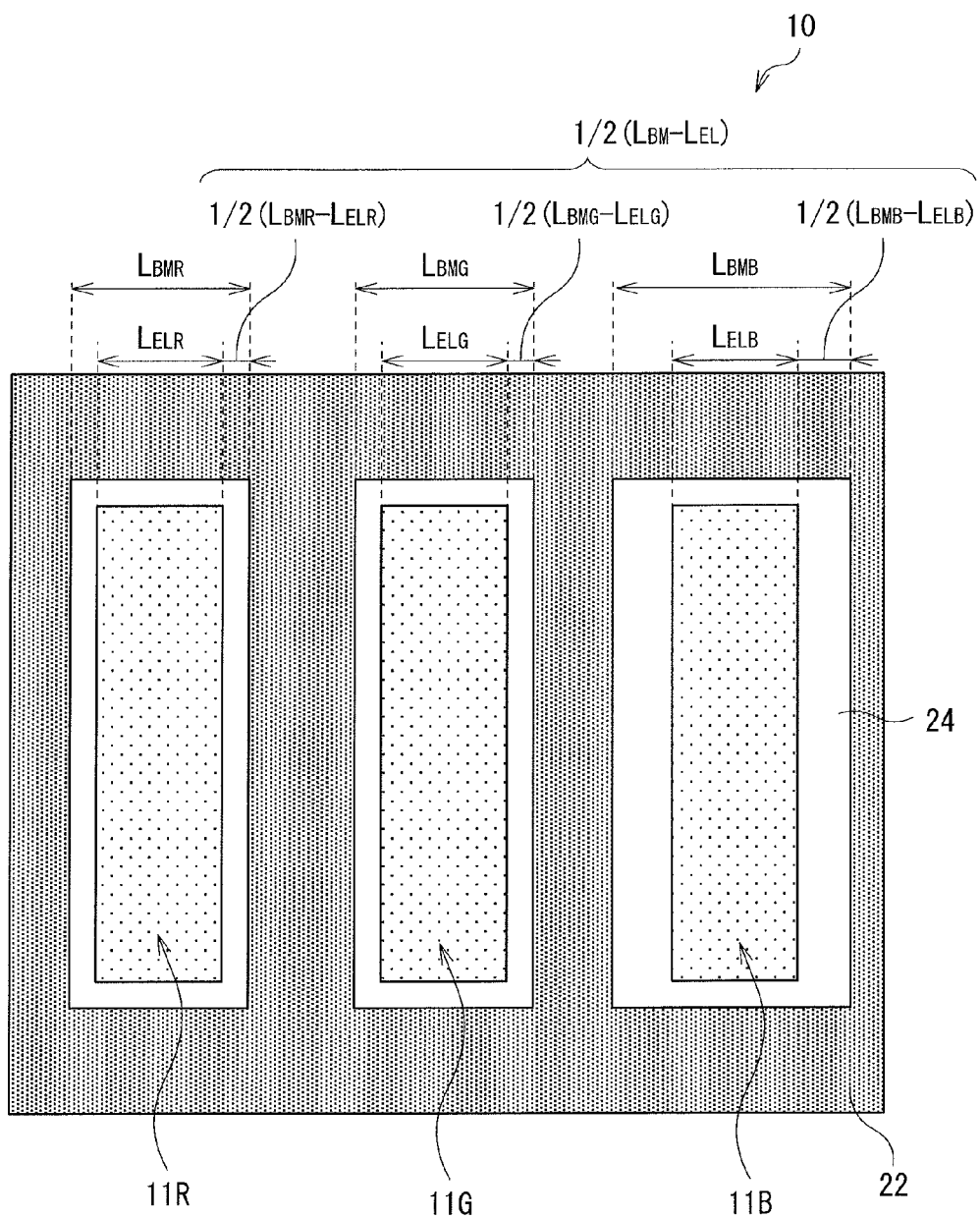
FIG. 2 is a plan view showing one pixel of the display device shown in FIG. 1 in an enlarged manner.

FIG. 2 shows a planar configuration of one of the pixels 10 shown in FIG. 1 in an enlarged manner. The self-luminous elements 10R, 10G and 10B have emission regions 11R, 11G and 11B, respectively. A light blocking film 22 as a black matrix is opposed to boundary portions between the emission regions 11R, 11G and 11B adjacent to one another.

The emission regions 11R, 11G and 11B have, for example, a longitudinal rectangular shape each, where a vertical dimension (hereinafter, called length) in a display plane is larger than a horizontal dimension (hereinafter, called width) in the plane. The rectangular shape described herein includes not only a geometrically perfect, rectangular shape but also a substantially rectangular shape despite having a notch corresponding to under TFT depending on a layout of the under TFT or the like. The display plane refers to a plane parallel to the paper in FIG. 2.

For example, the light blocking film 22 is configured of a black resin film mixed with a black colorant, the film having an optical density of at least 1, or a thin-film filter using interference of light in a thin film. The black resin film is preferably used to configure the light blocking film because the light blocking film may be easily formed at low cost. The thin-film filter, which is formed by stacking at least one of thin films including metal, metal nitride, metal oxide or the like, attenuates light by using interference of light in a thin film. Specifically, the thin-film filter includes a filter formed by alternately stacking films of chromium and chromium oxide (III) ($Cr_2O_3$).

Figure 3:
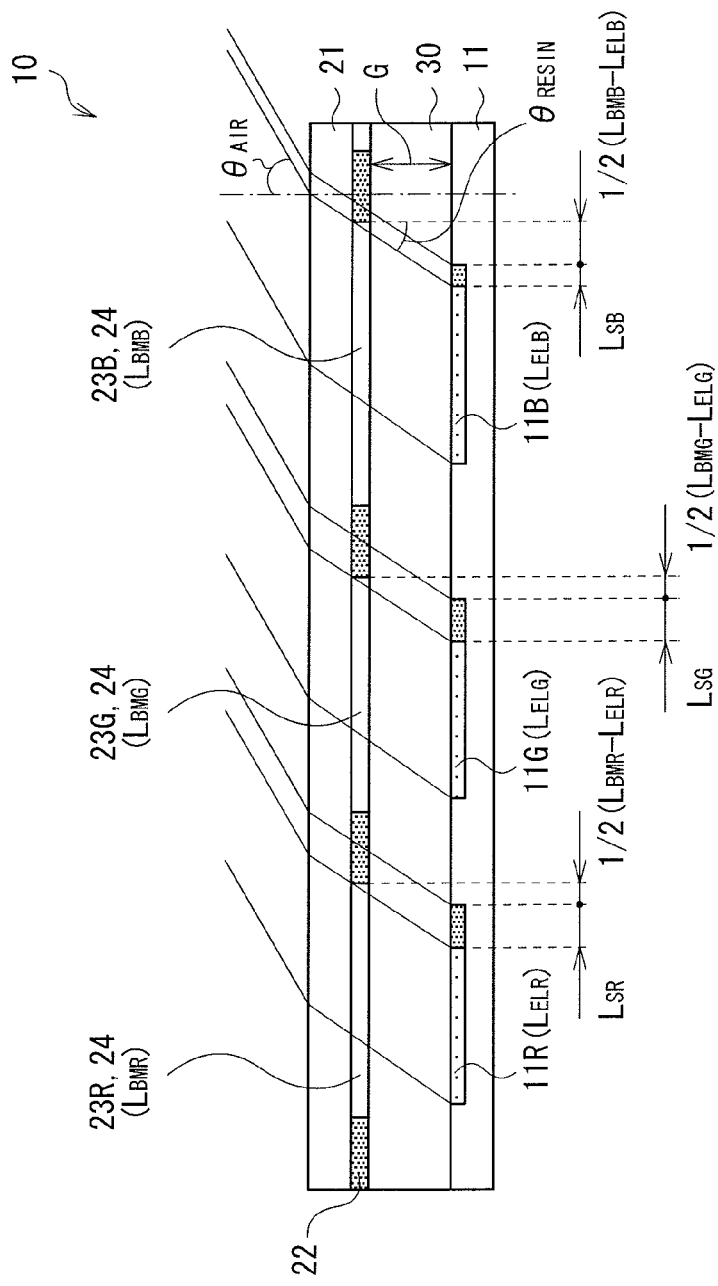
FIG. 3 is a section view along a III-III line of the pixel shown in FIG. 2.

FIG. 3 shows a sectional configuration of the pixel 10. The self-luminous elements 10R, 10G and 10B are disposed on a first substrate 11, and the light blocking film 22 is disposed on a second substrate 21. The first and second substrates 11 and 21 are configured of glass, a silicon (Si) wafer, or resin. The first and second substrates 11 and 21 are opposed to each other with the self-luminous elements 10R, 10G and 10B and the light blocking film 22 on the inside of the substrates, respectively, and an intermediate layer 30 including resin or the like is provided between the substrates as necessary. The first and second substrates 11 and 21 correspond to a specific example of "a pair of opposed substrates".

In this way, the self-luminous elements 10R, 10G and 10B are provided on a substrate different from a substrate of the light blocking film 22. The reason for this is as follows. Sufficient heat resistance and reliability to endure a formation process of the light blocking film 22 are necessary for the self-luminous elements 10R, 10G and 10B in order to form the film 22 on the same substrate 11 as a substrate of the self-luminous elements. However, this is extremely difficult at present. Therefore, the light blocking film 22 is substantially necessary to be provided on the opposed, second substrate 21. As a result, a gap G corresponding to thickness of the intermediate layer 30 is formed between the emission regions 11R, 11G and 11B of the self-luminous elements 10R, 10G and 10B on the first substrate 11 and the light blocking film 22 on the second substrate 21.

A color filter 23 is provided for improving color purity on regions (openings 24 described later) except for the light blocking film 22 on the second substrate 21. The color filter 23 includes a red filter 23R, a green filter 23G, and a blue filter 23B, which are sequentially arranged in correspondence to the emission regions 11R, 11G and 11B. The red, green or blue filter 23R, 23G and 23B is configured of resin mixed with a pigment, and is adjusted such that light transmittance is high in a target wavelength range of red, green or blue, and low in other wavelength ranges by selecting an appropriate pigment.

Figure 14:
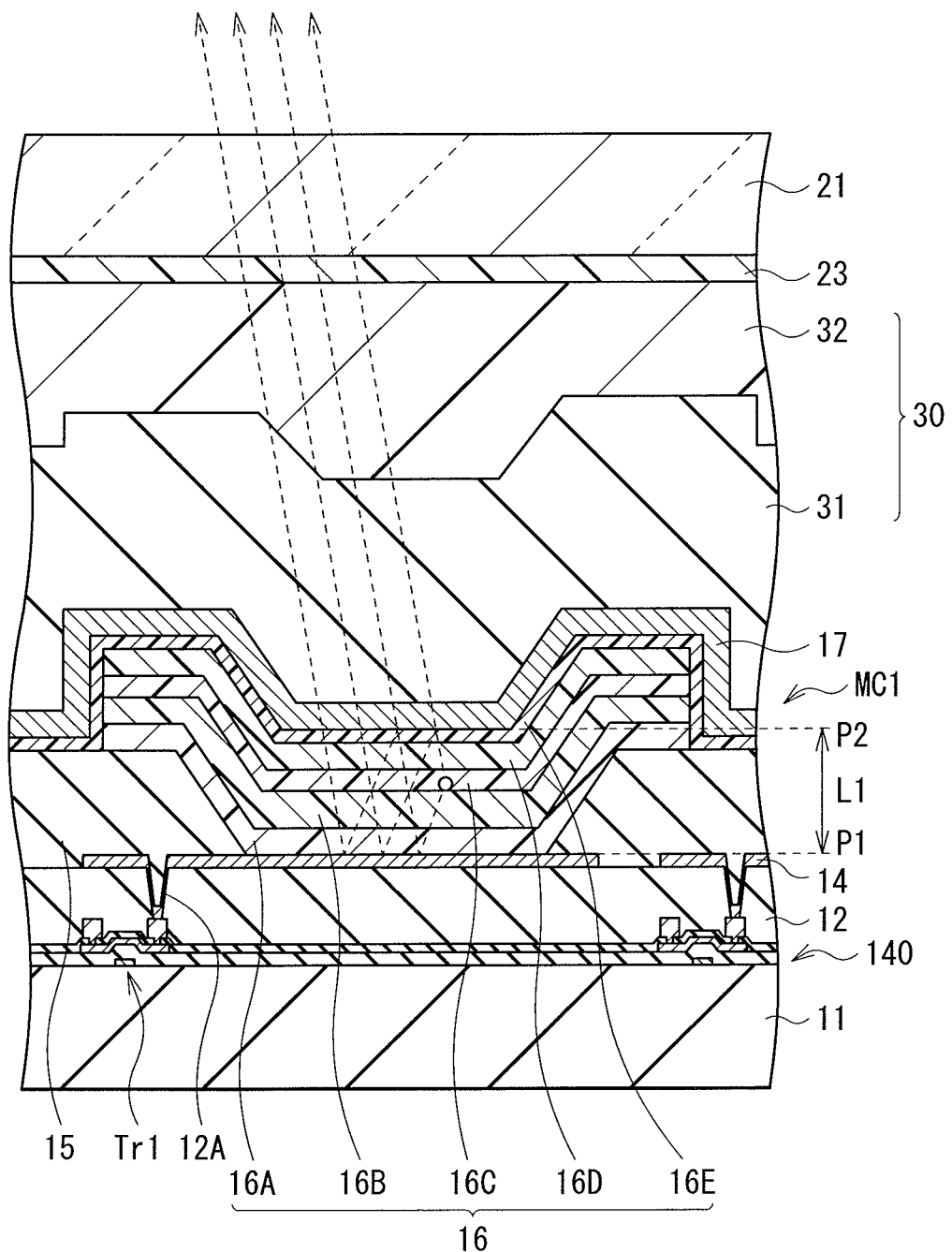
FIG. 14 is a section view showing a configuration of an organic EL element shown in FIG. 12.
Figure 15:
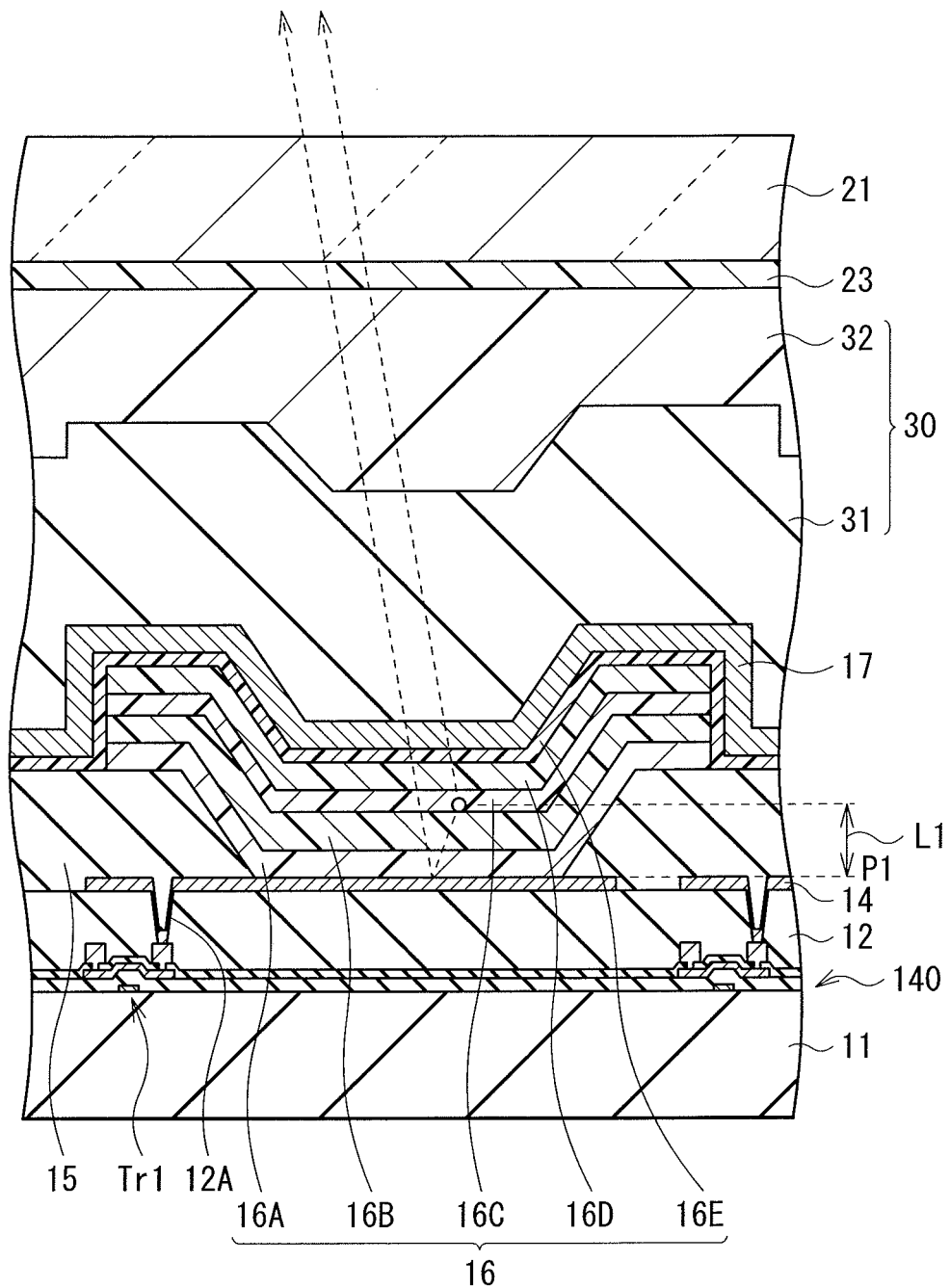
FIG. 15 is a section view showing another configuration of the organic EL element shown in FIG. 12.

The intermediate layer 30 includes, for example, a protective layer for protecting the self-luminous elements 10R, 10G and 10B, and an adhesion layer (both of them are not shown in FIG. 3, see FIGS. 14 and 15).

As shown in FIGS. 2 and 3, the light blocking film 22 has a plurality of openings 24, and the emission regions 11R, 11G and 11B are provided in correspondence to the openings 24. Length and width of each opening 24 is typically larger than length and width of each of the emission regions 11R, 11G and 11B. The reason for this is to prevent reduction in luminance by light blocking of part of the emission region 11R, 11G or 11B by the light blocking film 22 due to shift in position at which the first and second substrates 11 and 21 are attached to each other. Therefore, an end of each emission regions 11R, 11G and 11B is separated from openings 24 of the light blocking film 22. Such a separation, namely, a clearance in a display surface direction from the ends of the emission regions 11R, 11G and 11B to the opening 24 of the light blocking film 22 is expressed as $\frac{1}{2}(L_{BM}-L_{EL})$ ($L_{BM}$ denotes width of the opening 24, and $L_{EM}$ denotes width of the emission regions 11R, 11G and 11B). The display surface refers to a plane perpendicular to a paper in FIG. 3.

In the embodiment, a clearance, $\frac{1}{2}(L_{BMB}-L_{ELB})$, of the self-luminous element 10B is different from a clearance, $\frac{1}{2}(L_{BMR}-L_{ELR})$ or $\frac{1}{2}(L_{BMG}-L_{ELG})$, of another self-luminous elements 10R and 10G. This enables reduction in view-angle dependence of chromaticity of white or an intermediate color in the display device 1.

This is described in detail below with reference to FIGS. 2 and 3.

As shown in FIG. 3, in the case that the light blocking film 22 is disposed on the second substrate 21, when the self-luminous elements 10R, 10G and 10B on the first substrate 11 are viewed in an oblique direction, shadow portions appear by the light blocking film 22. If each shadow portion overlaps with the emission region 11R, 11G or 11B, such an overlapped region becomes a light blocked region where emitted light is blocked by the light blocking film 22, and thus luminance is decreased depending on width $L_{SR}$, $L_{SG}$ or $L_{SB}$ (hereinafter, called $L_S$ as a general term) of the light blocked region. That is, relative luminance Y considering light blocking of the light blocking film 22 is given as $Y=1-L_S/L_{EL}$.

In the example shown in FIG. 2, while width of the emission regions 11R, 11G and 11B are the same between all colors, width $L_{BMB}$ of the opening 24 facing the blue emission region 11B is larger than widths $L_{BMR}$ and $L_{BMG}$ of the openings 24 facing the red and green emission regions 11R and 11G. Accordingly, the clearance, $\frac{1}{2}(L_{BMB}-L_{ELB})$, of the blue self-luminous element 10B is larger than the clearances, $\frac{1}{2}(L_{BMR}-L_{ELR})$ and $\frac{1}{2}(L_{BMG}-L_{ELG})$, of the red and green self-luminous elements 10R and 10G. These are summarized in numerical expression 1.

Width of emission region: $L_{ELR}=L_{ELG}=L_{ELB}$

Width of opening: $L_{BMR}=L_{BMG}<L_{BMB}$

Size relationship between clearances: $\frac{1}{2}(L_{BMR}-L_{ELR})=\frac{1}{2}(L_{BMG}-L_{ELG})<\frac{1}{2}(L_{BMB}-L_{ELB})$   Numerical expression 1

In this case, the light blocked region $L_{SB}$ for blue is small compared with the light blocked regions $L_{SR}$ and $L_{SG}$ for red or green after a shadow of the light blocking film 22 appears in the emission regions 11R, 11G and 11B. That is, size relationship between the light blocked regions $L_{SR}$, $L_{SG}$ and $L_{SB}$ is expressed by numerical expression 2.

$L_{SR}=L_{SG}>L_{SB}$   Numerical expression 2

Since the relative luminance Y considering light blocking of the light blocking film 22 is given as $Y=1-L_S/L_{EL}$, magnitude relationship between luminance $Y_R$, $Y_G$ and $Y_B$ of the colors is expressed as numerical expression 3, and thus luminance of blue is relatively high at a view angle $\theta_{AIR}$. Therefore, chromaticity of white is gradually shifted toward blue with increase in view angle in the case of the pixel shown in FIGS. 2 and 3.

$Y_R=Y_G<Y_B$   Numerical expression 3

The light blocked region $L_S$ is obtained in the following way.

Assuming that a view angle in air is $\theta_{AIR}$, a view angle in resin configuring the intermediate layer 30 is $\theta_{RESIN}$, and a refractive index of the resin is n, numerical expression 4 is derived based on the Snell's law.

$\theta_{RESIN}=a*\sin(1/n*\sin\theta_{AIR})$   Numerical expression 4

The light blocked region $L_S$ is given by numerical expression 6 based on the numerical expression 4 and the following numerical expression 5.

$L_S+\frac{1}{2}(L_{BM}-L_{EL})=L_{RESIN}*\tan\theta_{RESIN}$   Numerical expression 5

$L_S=L_{RESIN}*\tan(a*\sin(1/n*\sin\theta_{AIR}))-\frac{1}{2}(L_{BM}-L_{EL})$   Numerical expression 6

Therefore, the width $L_S$ of the light blocked region at a resin thickness $L_{RESIN}$ and a view angle $\theta_{AIR}$ may be changed for each of colors by changing the clearance, $\frac{1}{2}(L_{BM}-L_{EL})$, from an end of the emission regions 11R, 11G and 11B to the opening 24 of the light blocking film 22.

In the case that width $L_{EL}$s of the emission regions 11R, 11G and 11B are fixed, when width $L_{BM}$ of the opening 24 is increased, width $L_S$ of the light blocked region is decreased, and conversely, when width $L_{BM}$ of the opening 24 is decreased, width $L_S$ of the light blocked region is increased. The width $L_{BMR}$, $L_{BMG}$ or $L_{BMB}$ of the opening 24 of the light blocking film 22 is changed, thereby the width $L_S$ of the light blocked region of each color, namely, a luminance-to-view angle ratio may be changed. The luminance-to-view-angle ratio is changed in such a way, so that chromaticity of white or an intermediate color including mixture of the relevant colors is changed depending on view angles.

Chromaticity of white is preferably changed depending on view angles for image quality in the case that the amount of change in chromaticity itself is small, or the case that the chromaticity is changed in a direction along a locus of black-body radiation so that the change in chromaticity is hard to be viewed as color drift. Accordingly, even in the embodiment, it is desirable that the width $L_S$ of the light blocked region of each color, namely, the clearance, $\frac{1}{2}(L_{BM}-L_{EL})$, is determined such that one or both of the amount of change in chromaticity and a change direction of chromaticity may be improved.

Hereinafter, calculation examples 1 and 2 using specific numerical values are described.

Calculation Example 1

Figure 4:
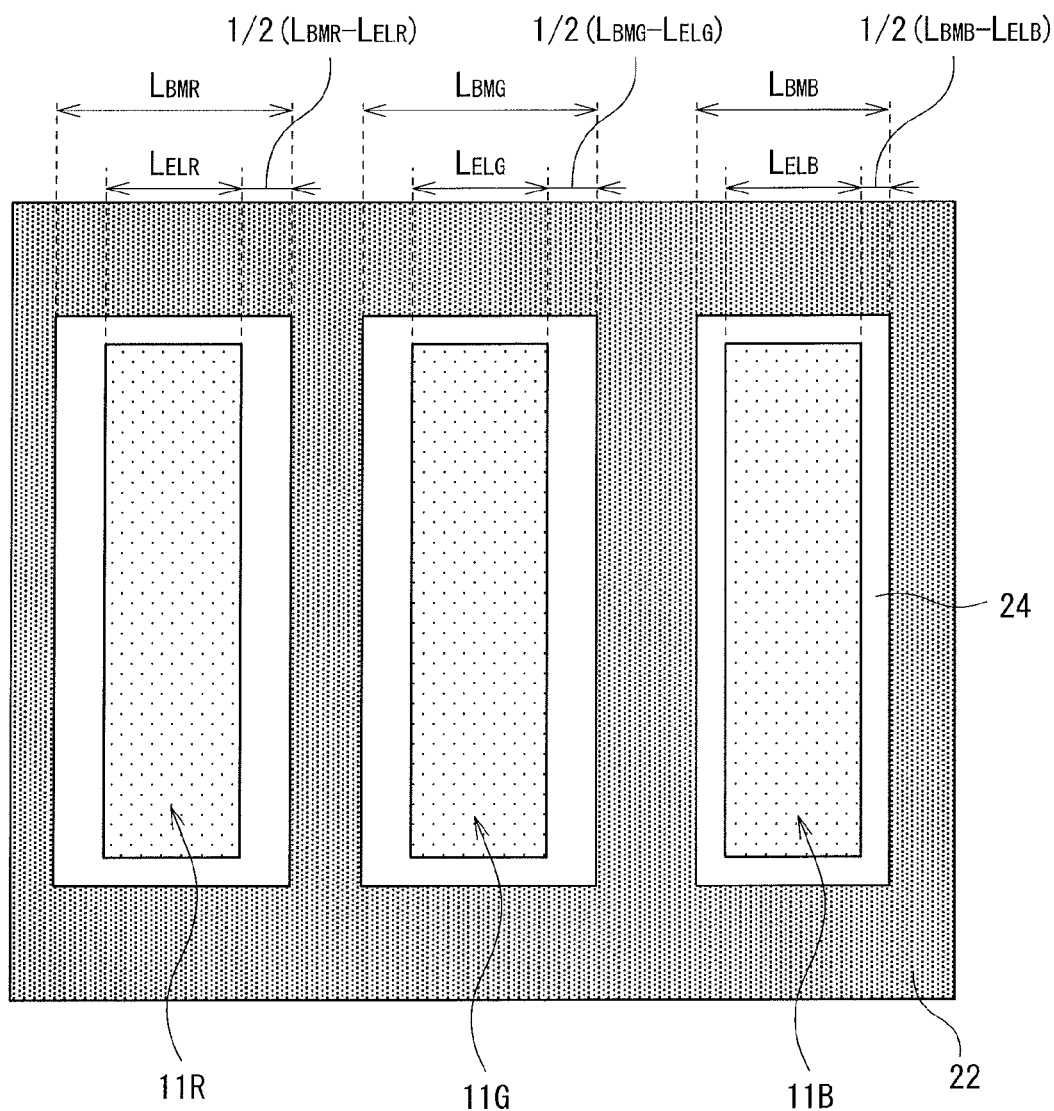
FIG. 4 is a plan view showing a pixel according to calculation example 1 in an enlarged manner.
Figure 5:
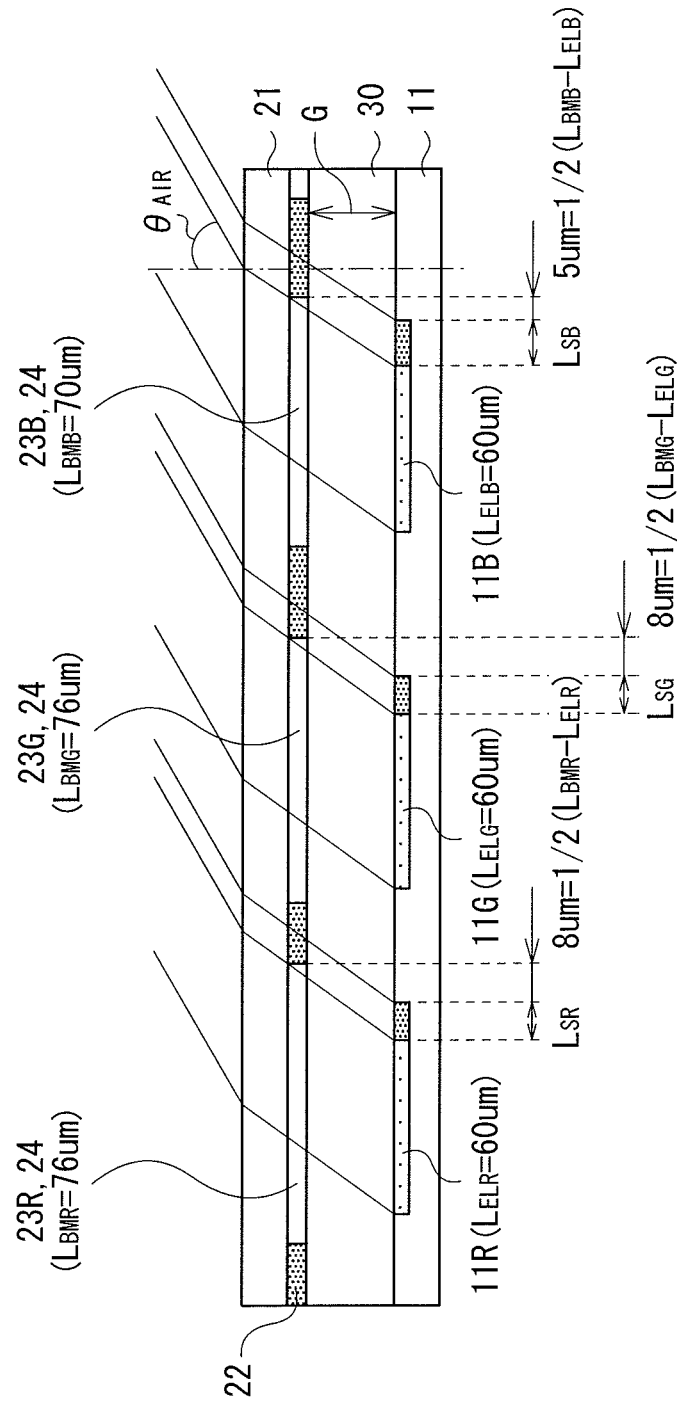
FIG. 5 is a section view of the pixel shown in FIG. 4.

FIGS. 4 and 5 show a planar configuration and a sectional configuration of a pixel 10 according to calculation example 1, respectively. In the calculation example 1, as shown in FIG. 4, while widths of the emission regions 11R, 11G and 11B are the same between all colors, width $L_{BMB}$ of the opening 24 facing the blue emission region 11B is smaller than widths $L_{BMR}$ and $L_{BMG}$ of the openings 24 facing the red and green emission regions 11R and 11G. Accordingly, the clearance, $\frac{1}{2}(L_{BMB}-L_{ELB})$, of the blue self-luminous element 10B is smaller than the clearances, $\frac{1}{2}(L_{BMR}-L_{ELR})$ and $\frac{1}{2}(L_{BMG}-L_{ELG})$, of the red and green self-luminous elements 10R and 10G. These are summarized in numerical expression 7.

Width of emission region: $L_{ELR}=L_{ELG}=L_{ELB}=60$ μm

Width of opening: $L_{BMR}=L_{BMG}=76$ μm, $L_{BMB}=70$ μm

Red clearance: $\frac{1}{2}(L_{BMR}-L_{ELR})=8$ μm

Green clearance: $\tfrac{1}{2}(L_{BMG}-L_{ELG})=8$ μm

Blue clearance: $\tfrac{1}{2}(L_{BMB}-L_{ELB})=5$ μm   Numerical expression 7

Figure 6:
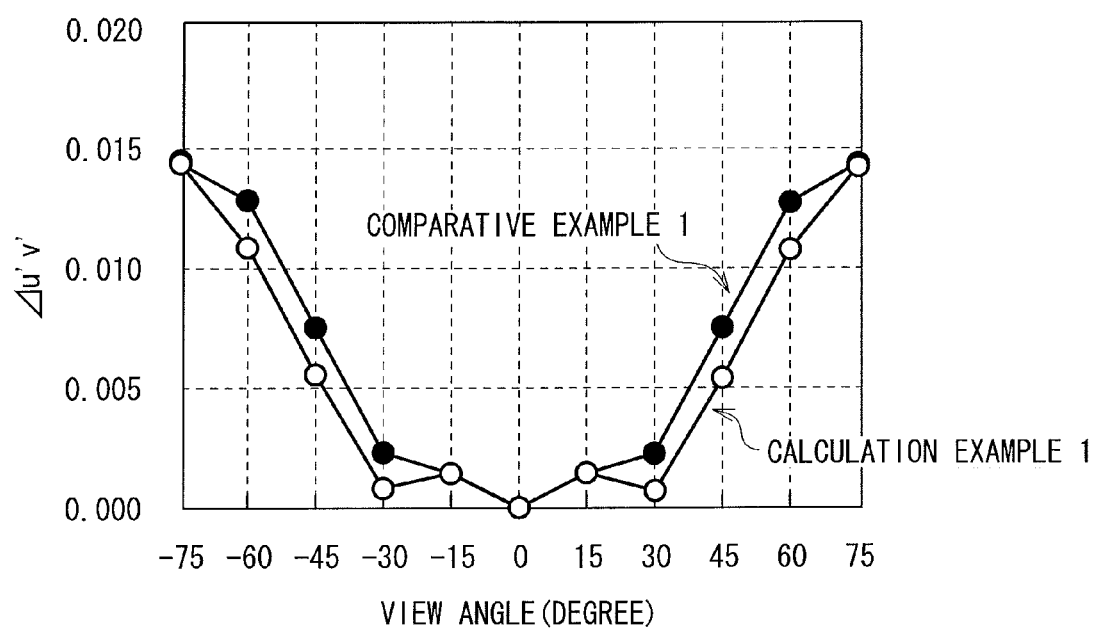
FIG. 6 is a graph showing a chromaticity-to-view angle characteristic of the pixel shown in FIG. 4.

FIG. 6 shows a calculation result of a chromaticity-to-view angle characteristic Δu'v' in the calculation example 1. In such calculation, it is assumed that the first and second substrates 11 and 21 are attached to each other with an intermediate layer 30 including resin having a thickness of 20 μm and a refractive index of 1.5.

Figure 7:
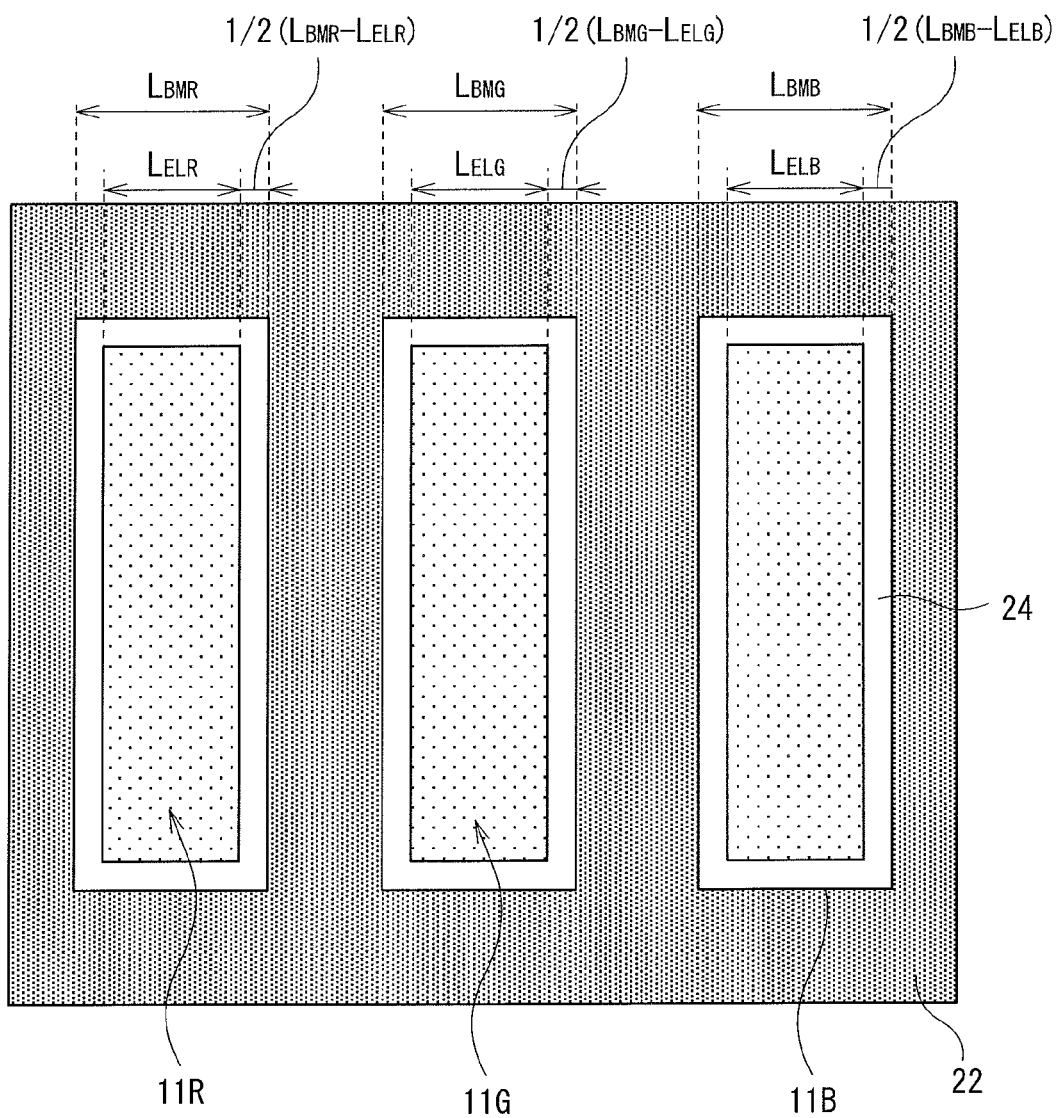
FIG. 7 is a plan view showing a pixel according to comparative example 1 in an enlarged manner.

As a comparative example 1, the chromaticity-to-view angle characteristic Δu'v' is calculated in the same way as in the calculation example 1 even in the case that width of the opening 24 is assumed to be the same between all colors ($L_{BMR}=L_{BMG}=L_{BMB}=70$ μm) as shown in FIG. 7. A result of such calculation is collectively shown in FIG. 6.

As known from FIG. 6, in the calculation example 1, the amount of change in chromaticity Δu'v' from chromaticity at a view angle 0° is reduced compared with that in the comparative example 1 in view angles of at least 30 degrees at which light blocking begins to occur by the light blocking film 22, showing improvement in chromaticity-to-view angle characteristic.

Calculation Example 2

Figure 8:
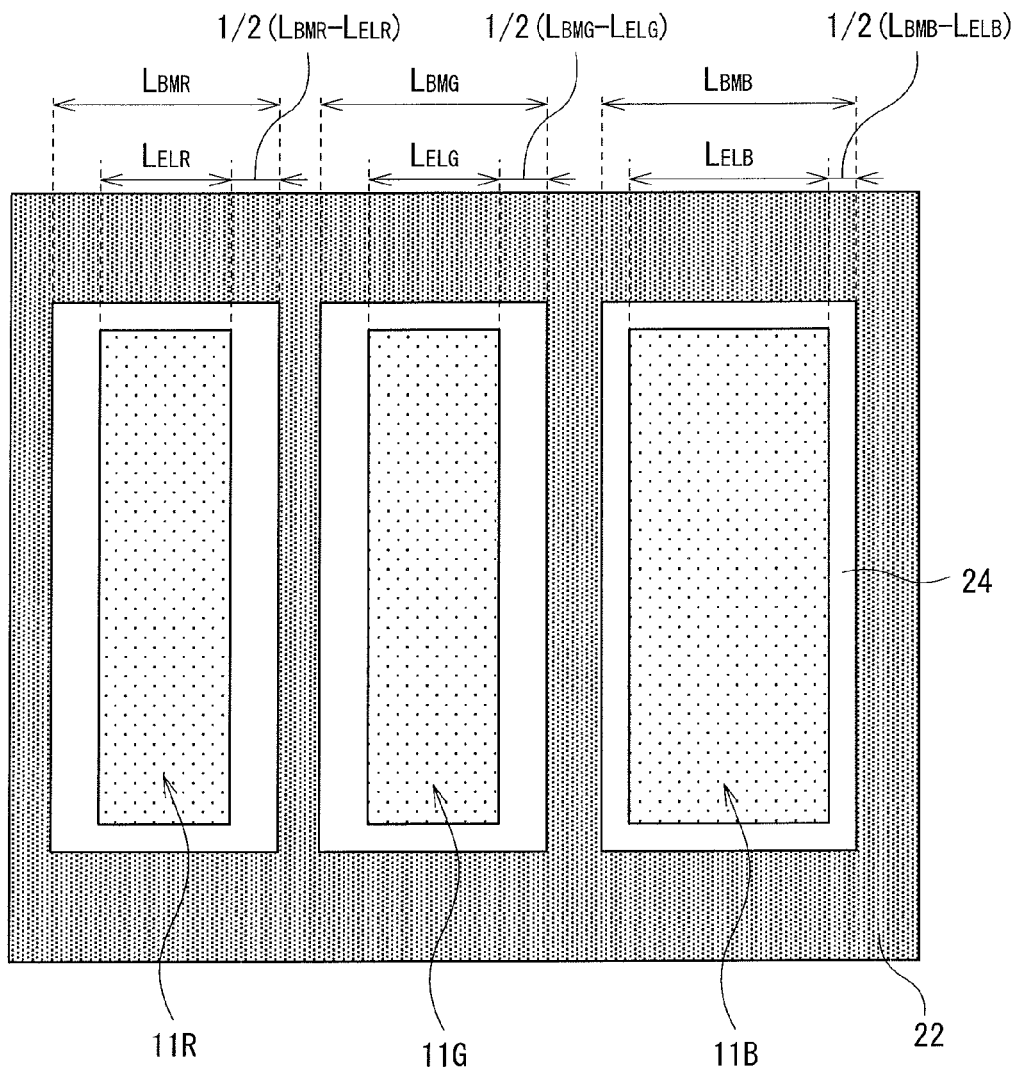
FIG. 8 is a plan view showing a pixel according to calculation example 2 in an enlarged manner.
Figure 9:
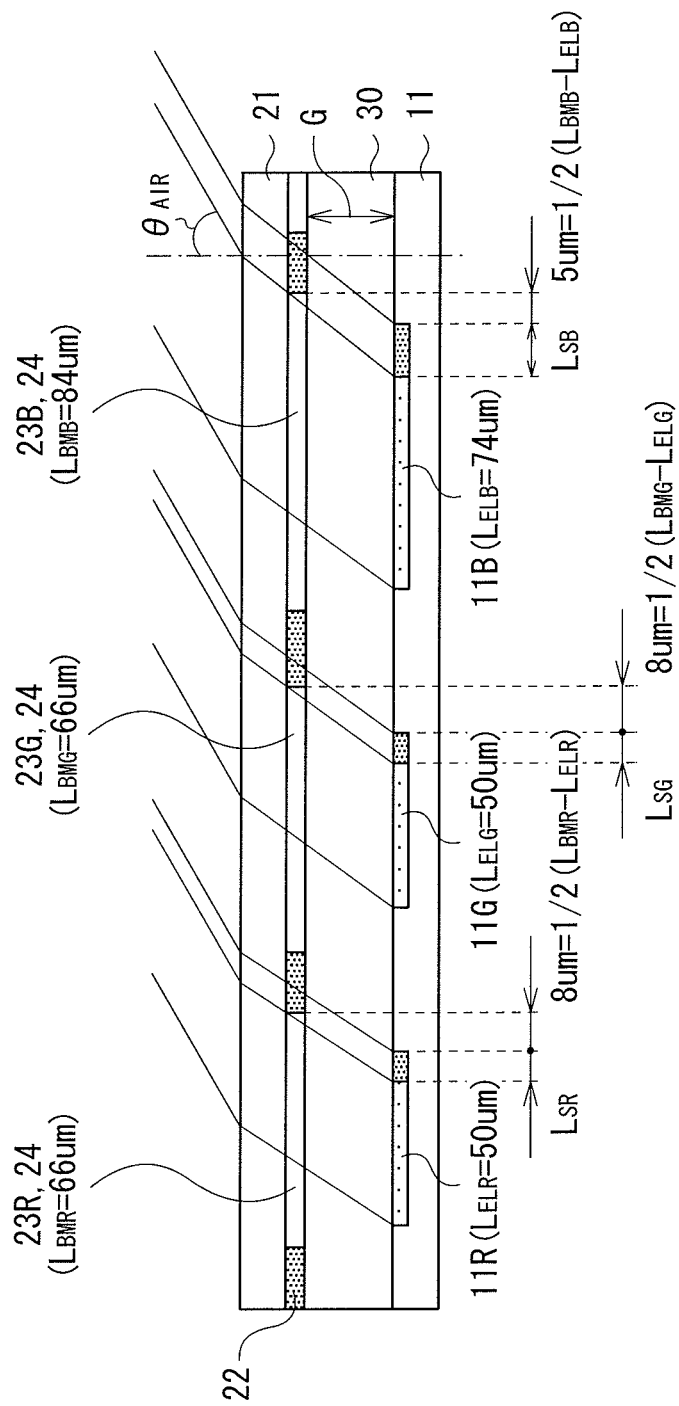
FIG. 9 is a section view of the pixel shown in FIG. 8.

FIGS. 8 and 9 show a planar configuration and a sectional configuration of a pixel 10 according to calculation example 2. In the calculation example 2, as shown in FIG. 8, width $L_{ELB}$ of the blue emission region 11B is larger than widths $L_{LER}$ and $L_{LEG}$ of the red and green emission regions 11R and 11G. In addition, width $L_{BMB}$ of the opening 24 facing the blue emission region 11B is larger than widths $L_{BMR}$ and $L_{BMG}$ of the openings 24 facing the red and green emission regions 11R and 11G. Accordingly, the clearance, $\tfrac{1}{2}(L_{BMB}-L_{ELB})$, of the blue self-luminous element 10B is smaller than the clearances, $\tfrac{1}{2}(L_{BMR}-L_{ELR})$ and $\tfrac{1}{2}(L_{BMG}-L_{ELG})$, of the red and green self-luminous elements 10R and 10G. These are summarized in numerical expression 8.

Width of emission region: $L_{ELR}=L_{ELG}=50$ μm, $L_{ELB}=74$ μm

Width of opening: $L_{BMR}=L_{BMG}=66$ μm, $L_{BMB}=84$ μm

Red clearance: $\tfrac{1}{2}(L_{BMR}-L_{ELR})=8$ μm

Green clearance: $\tfrac{1}{2}(L_{BMG}-L_{ELG})=8$ μm

Blue clearance: $\tfrac{1}{2}(L_{BMB}-L_{ELB})=5$ μm   Numerical expression 8

The reason why width $L_{ELB}$ of the blue emission region 11B is larger than widths $L_{LER}$ and $L_{LEG}$ of the red and green emission regions 11R and 11G in the calculation example 2 is as follows. In the self-luminous elements 10R, 10G and 10B, in which luminance reduction occurs due to electric current, such as an organic EL element, life of the self-luminous element is lengthened with decrease in density of an electric current flowing through the self-luminous elements 10R, 10G and 10B. Moreover, since a level of luminance reduction with emission time is varied depending on emission colors, in the case that the respective-color emission regions 11B, 11G and 11B are assumed to have the same area, luminance balance between emission colors is disrupted with a lapse of time, causing change in chromaticity of white or an intermediate color.

Therefore, improvement in life of the self-luminous element 10B may be achieved by increasing the width $L_{ELB}$ of the emission region 11B of a color having a short life (specifically, blue). Furthermore, a drive condition such as current density is adjusted for each color, thereby luminance reduction with emission time may be adjusted to be approximately even between all colors, leading to suppression of temporal change in chromaticity of white or an intermediate color.

However, in the case that dimensions of the emission regions 11R, 11G and 11B are varied depending on emission colors in this way, a ratio of area of the light blocked region $L_{SR}$, $L_{SG}$ or $L_{SB}$ caused by the light blocking film 22 to area of the emission region 11R, 11G or 11B is also varied depending on emission colors. Therefore, luminance reduction due to the light blocking film 22 becomes uneven between the colors, resulting in disruption of white balance, and consequently chromaticity of white or an intermediate color may be changed depending on view angles.

Therefore, in the calculation example 2, the clearance, $\tfrac{1}{2}(L_{BMB}-L_{ELB})$, of the blue self-luminous element 10B having a large width of the emission region 11B is smaller than the clearances, $\tfrac{1}{2}(L_{BMR}-L_{ELR})$ and $\tfrac{1}{2}(L_{BMG}-L_{ELG})$, of the red and green self-luminous elements 10R and 10G. Thus, each of luminance reduction with emission time and luminance reduction caused by light blocking of the light blocking film 22 may be adjusted to be approximately even between all colors, leading to suppression of change in chromaticity depending on view angles of white or an intermediate color.

Figure 10:
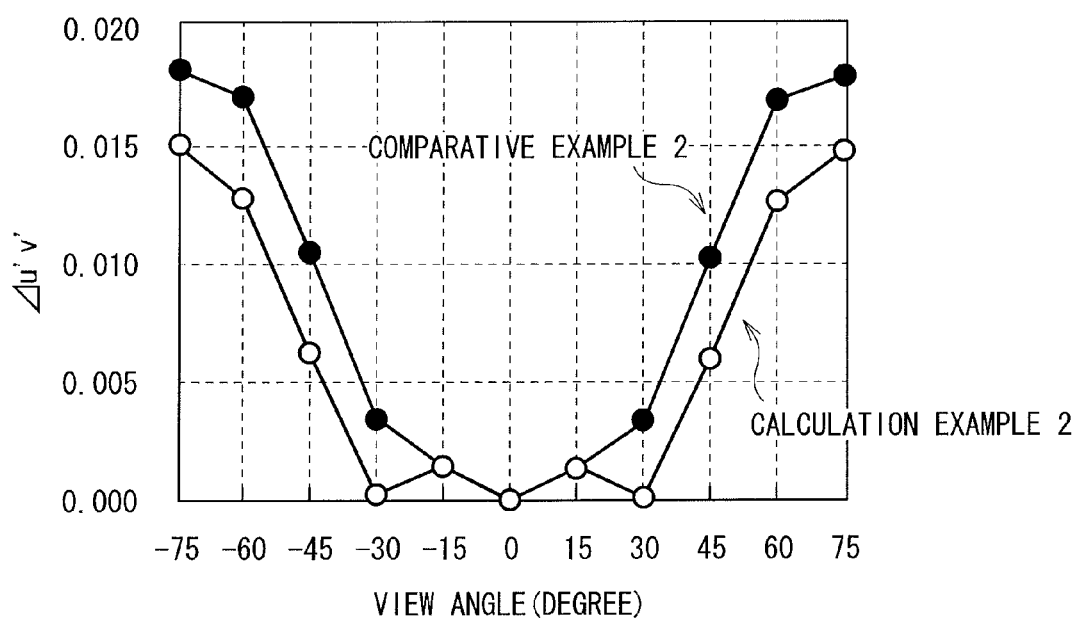
FIG. 10 is a graph showing a chromaticity-to-view angle characteristic of the pixel shown in FIG. 8.

FIG. 10 shows a calculation result of a chromaticity-to-view angle characteristic Δu'v' in the calculation example 2. In such calculation, it is assumed that the first and second substrates 11 and 21 are attached to each other with an intermediate layer 30 including resin having a thickness of 20 μm and a refractive index of 1.5.

Figure 11:
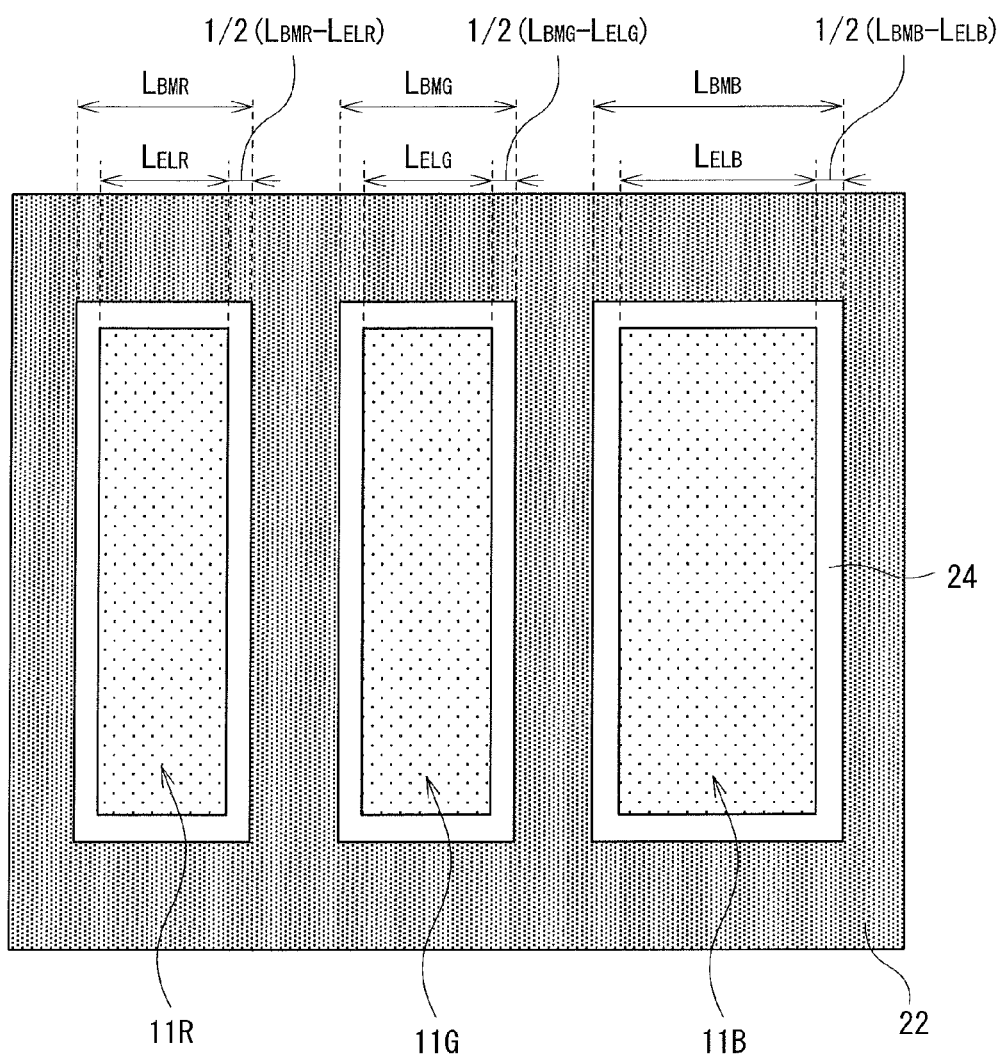
FIG. 11 is a plan view showing a pixel according to comparative example 2 in an enlarged manner.

As a comparative example 2, the chromaticity-to-view angle characteristic Δu'v' is calculated in the same way as in the calculation example 2 even in the case that the clearances, $\tfrac{1}{2}(L_{BM}-L_{EL})$, are assumed to be the same (5 μm) between all colors as shown in FIG. 11. A result of such calculation is collectively shown in FIG. 10.

As known from FIG. 10, in the calculation example 2, the amount of change in chromaticity Δu'v' from chromaticity at a view angle 0° is reduced compared with that in the comparative example 2 in view angles of at least 30 degrees at which light blocking begins to occur by the light blocking film 22, showing improvement in chromaticity-to-view angle characteristic.

While description has been made on a case where the clearance, $\tfrac{1}{2}(L_{BM}-L_{EL})$, in a horizontal direction in a display plane is varied depending on emission colors in the description of the principle and the calculation examples 1 and 2, a clearance in a vertical direction in a display plane may be varied depending on emission colors. Furthermore, both the clearances in the horizontal and vertical directions in a display plane may be varied depending on emission colors. However, as shown in FIG. 2, influence of light blocking of the light blocking film 22 is large in the horizontal direction, in which widths of the emission regions 11R, 11G and 11B are small, and small in the vertical direction in the pixel 10 having the emission regions 11R, 11G and 11B being elongated in the vertical direction in a display plane. Therefore, a sufficient effect is obtained even in the case that only the clearance in the horizontal direction, in which the influence of light blocking is large, is varied depending on emission colors.

In the description of the principle and the calculation examples 1 and 2, description has been made on a case where the width $L_{ELB}$ or the clearance, $\tfrac{1}{2}(L_{BMB}-L_{ELB})$, of the blue emission region 11B is made different from the widths $L_{ELR}$ and $L_{ELG}$, or the clearances, $\tfrac{1}{2}(L_{BMR}-L_{ELR})$ and $\tfrac{1}{2}(L_{BMG}-L_{ELG})$, of the red and green emission regions 11R and 11G.

However, the width $L_{ELR}$ or the clearance, $\frac{1}{2}(L_{BMR}-L_{ELR})$, of the red emission region 11R may be made different from the widths $L_{ELG}$ and $L_{ELB}$, or the clearances, $\frac{1}{2}(L_{BMG}-L_{ELG})$ and $\frac{1}{2}(L_{BMG}-L_{ELB})$, of the green and blue emission regions 11G and 11B. Alternatively, the width $L_{ELG}$ or the clearance, $\frac{1}{2}(L_{BMG}-L_{ELG})$, of the green emission region 11G may be made different from the widths $L_{ELR}$ and $L_{ELB}$, or the clearances, $\frac{1}{2}(L_{BMR}-L_{ELR})$ and $\frac{1}{2}(L_{BMB}-L_{ELB})$, of the red and blue emission regions 11R and 11B. However, since the blue self-luminous element 10B has a short life compared with other color elements, the width $L_{ELB}$ or the clearance, $\frac{1}{2}(L_{BMG}-L_{ELB})$, of the blue emission region 11B is preferably made different from the widths $L_{ELR}$ and $L_{ELG}$, or the clearances, $\frac{1}{2}(L_{BMR}-L_{ELR})$ and $\frac{1}{2}(L_{BMG}-L_{ELG})$, of the red and green emission regions 11R and 11G.

Furthermore, all the widths $L_{ELR}$, $L_{ELG}$ and $L_{ELB}$, or the clearances $\frac{1}{2}(L_{BMR}-L_{ELR})$, $\frac{1}{2}(L_{BMG}-L_{ELG})$ and $\frac{1}{2}(L_{BMG}-L_{ELB})$ of the red, green and blue emission regions 11R, 11G and 11B may be made different from one another.

Figure 12:
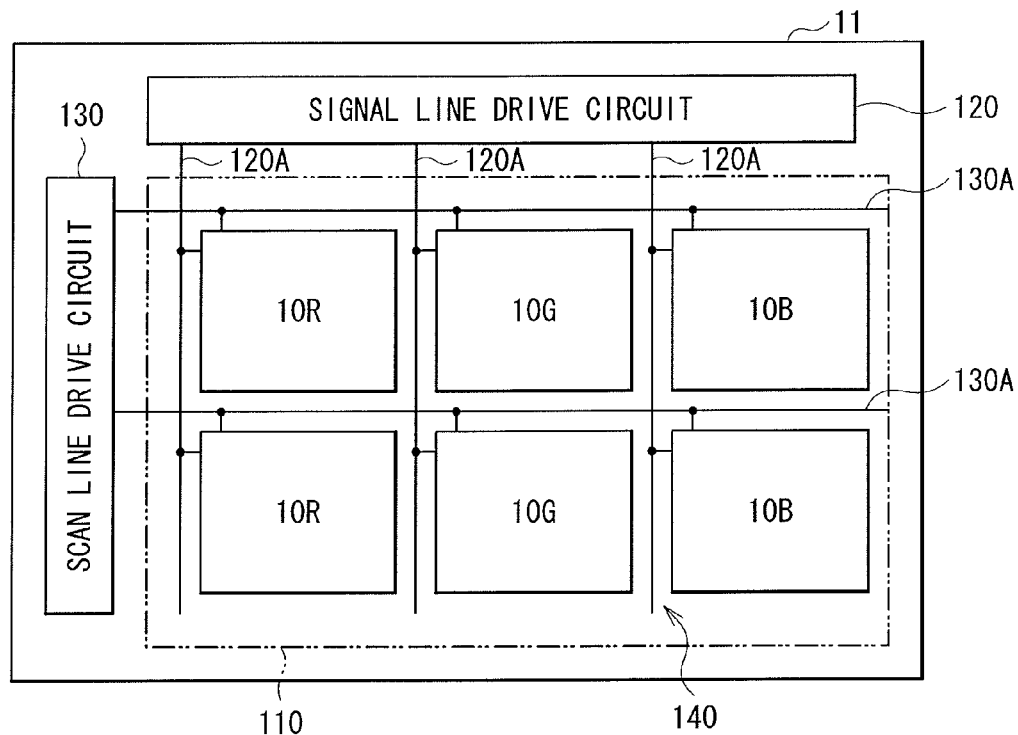
FIG. 12 is a diagram showing a configuration of the display device shown in FIG. 1.

FIG. 12 shows an example of the display device 1. The display device 1 is used as an organic EL television apparatus having organic EL elements as the self-luminous elements 10R, 10G and 10B, and has, for example, a signal line drive circuit 120 and a scan line drive circuit 130 as drivers for video display around a display region 110.

Figure 13:
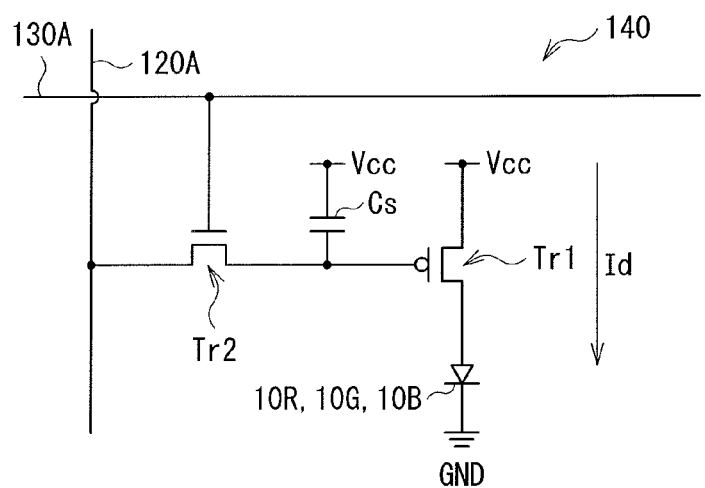
FIG. 13 is a diagram showing an example of a pixel drive circuit shown in FIG. 12.

A pixel drive circuit 140 is provided in the display region 110. FIG. 13 shows an example of a configuration of the pixel drive circuit 140. The pixel drive circuit 140 is an active drive circuit formed under a lower electrode 14 described later. Specifically, the pixel drive circuit 140 includes a drive transistor Tr1 and a write transistor Tr2, a capacitor (retentive capacity) Cs between the transistors Tr1 and Tr2, and an organic EL element 10R (10G or 10B) connected in series to the drive transistor Tr1 between a first power line (Vcc) and a second power line (GND). The drive transistor Tr1 and the write transistor Tr2 are configured of a typical thin film transistor (TFT) each, and a structure of the transistor may be an inverted staggered structure (bottom gate type) or a staggered structure (top gate type), namely, the structure is not particularly limited.

In the pixel drive circuit 140, a plurality of signal lines 120A are arranged in a column direction, and a plurality of scan lines 130A are arranged in a row direction. An intersection of each signal line 120A and each scan line 130A corresponds to one of the organic EL elements 10R, 10G and 10B (sub pixel). Each signal line 120A is connected to the signal line drive circuit 120, and an image signal is supplied from the signal line drive circuit 120 to a source electrode of each write transistor Tr2 via a signal line 120A. Each scan line 130A is connected to the scan line drive circuit 130, and a scan signal is sequentially supplied from the scan line drive circuit 130 to a gate electrode of each write transistor Tr2 via the scan line 130A.

FIG. 14 shows a sectional configuration of the self-luminous elements 10R, 10G and 10B. Each of the self-luminous elements 10R, 10G and 10B is an organic EL element in which the drive transistor Tr1 of the pixel drive circuit 140, a planarization insulating film 13, the lower electrode 14 as an anode, an inter-electrode insulating film 15, an organic layer 16 including a light emitting layer 16C described later, and an upper electrode 17 as a cathode are stacked in this order from a first substrate 11 side. The drive transistor Tr1 is electrically connected to the lower electrode 14 via a connection hole 13A provided in the planarization insulating film 13.

Such self-luminous elements 10R, 10G and 10B are covered with a protective layer 31, and sealed by attaching the second substrate 21 over the whole surface of the protective layer 31 with an adhesion layer 32 in between. The protective layer 31 is configured of silicon nitride ($SiN_x$), silicon oxide, a metal oxide or the like. The adhesion layer 32 is configured of, for example, thermosetting resin or ultraviolet curing resin. The protective layer 31 and the adhesion layer 32 configure the intermediate layer 30.

The planarization insulating film 13, which planarizes a surface of the first substrate 11 having the pixel drive circuit 140 formed thereon, is preferably configured of a material being high in pattern accuracy because fine connection holes 13A are to be formed in the film 13. As a material of the planarization insulating film 13, for example, an organic material such as polyimide, or an inorganic material such as silicon oxide ($SiO_2$) is listed.

The lower electrode 14 acts even as a reflective layer, and desirably has a high reflectance to the utmost for improving luminous efficiency. In particular, when the lower electrode 14 is used as an anode, the electrode 14 is desirably configured of a material having a high hole-injection performance. For example, such a lower electrode 14 has a thickness in a stacking direction (hereinafter, simply called thickness) of 100 nm to 1000 nm both inclusive, and includes a simple substance or an alloy of a metal element such as chromium (Cr), gold (Au), platinum (Pt), nickel (Ni), copper (Cu), tungsten (W) or silver (Ag). A transparent conductive film including indium-tin oxide (ITO) or the like may be provided on a surface of the lower electrode 14. Even a material such as an aluminum (Al) alloy, which has an undesirable hole injection barrier due to existence of a surface oxide film or a work function being not large while having a high reflectance, may be used as the lower electrode 14 by providing an appropriate hole injection layer.

The inter-electrode insulating film 15, which ensures isolation between the lower electrode 14 and the upper electrode 17, and makes the emission regions 11R, 11G and 11B to be into a desired shape, is configured of, for example, photosensitive resin. The inter-electrode insulating film 15 is provided only in the periphery of each lower electrode 14, and regions of the lower electrode 14 exposed from the inter-electrode insulating film 15 correspond to the emission regions 11R, 11G and 11B. While the organic layer 16 and the upper electrode 17 are provided on the inter-electrode insulating film 15, light emission occurs only in the emission regions 11R, 11G and 11B.

The organic layer 16 has, for example, a configuration in which a hole injection layer 16A, a hole transport layer 16B, a light emitting layer 16C, an electron transport layer 16D and an electron injection layer 16E are stacked in this order from a lower electrode 14 side. Among them, layers other than the light emitting layer 16C may be provided as necessary. The organic layer 16 may be different in configuration depending on emission colors of the self-luminous elements 10R, 10G and 10B. The hole injection layer 16A improves hole injection efficiency, and besides acts as a buffer layer for preventing current leakage. The hole transport layer 16B improves efficiency of hole transport to the light emitting layer 16C. The light emitting layer 16C emits light through recombination of electrons and holes in response to an applied electric field. The electron transport layer 16D improves efficiency of electron transport to the light emitting layer 16C. The electron injection layer 16E improves electron injection efficiency.

For example, the hole injection layer 16A of the self-luminous element 10R has a thickness of 5 nm to 300 nm both inclusive, and is configured of a hexaazatriphenylene derivative shown in a chemical formula 1 or 2. For example, the hole transport layer 16B of the self-luminous element 10R has a thickness of 5 nm to 300 nm both inclusive, and is configured of bis[(N-naphtyl)-N-phenyl]benzidine (α-NPD). For example, the light emitting layer 16C of the self-luminous element 10R has a thickness of 10 nm to 100 nm both inclusive, and is configured of 8-quinolinol/aluminum complex ($Alq_3$) mixed with 2,6-bis[4-[N-(4-methoxyphenyl)-N-phenyl]aminostyril]naphthalene-1,5-dicarbonitrile (BSN-BCN) of 40 percent by volume. For example, an electron transport layer 16D of the self-luminous element 10R has a thickness of 5 nm to 300 nm both inclusive, and is configured of $Alq_3$. For example, an electron injection layer 16E of the self-luminous element 10R has a thickness of about 0.3 nm, and is configured of LiF or $Li_2O$.

Chemical formula 1

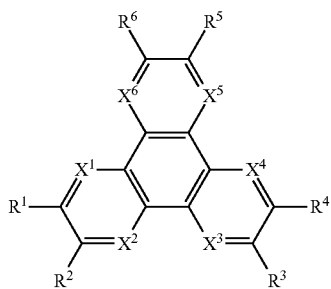

In the chemical formula 1, R1 to R6 represent substituent groups respectively selected from hydrogen, halogen, a hydroxyl group, an amino group, an arylamino group, a substituted or non-substituted carbonyl group having a carbon number of 20 or less, a substituted or non-substituted carbonyl ester group having a carbon number of 20 or less, a substituted or non-substituted alkyl group having a carbon number of 20 or less, a substituted or non-substituted alkenyl group having a carbon number of 20 or less, a substituted or non-substituted alkoxyl group having a carbon number of 20 or less, a substituted or non-substituted aryl group having a carbon number of 30 or less, a substituted or non-substituted heterocyclic-group having a carbon number of 30 or less, a nitrile group, a cyano group, a nitro group, or a silyl group; and adjacent Rm (m=1 to 6) may be bonded to each other through a cyclic structure. X1 to X6 each represent a carbon or nitrogen atom.

Specifically, the hole injection layer 16A of the self-luminous element 10R is preferably configured of a material shown in the chemical formula 2.

Chemical formula 2

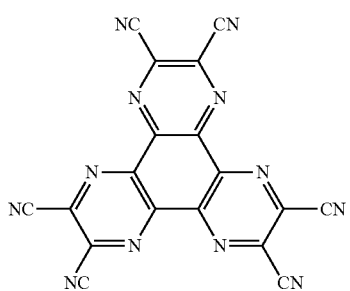

For example, a hole injection layer 16A of the self-luminous element 10G has a thickness of 5 nm to 300 nm both inclusive, and is configured of a hexaazatriphenylene derivative shown in the chemical formula 1 or 2. For example, a hole transport layer 16B of the self-luminous element 10G has a thickness of 5 nm to 300 nm both inclusive, and is configured of α-NPD. For example, a light emitting layer 16C of the self-luminous element 10G has a thickness of 10 nm to 100 nm both inclusive, and is configured of $Alq_3$ mixed with coumarin 6 of 1 percent by volume. For example, an electron transport layer 16D of the self-luminous element 10G has a thickness of 5 nm to 300 nm both inclusive, and is configured of $Alq_3$. For example, an electron injection layer 16E of the self-luminous element 10G has a thickness of about 0.3 nm, and is configured of LiF or $Li_2O$.

For example, a hole injection layer 16A of the self-luminous element 10B has a thickness of 5 nm to 300 nm both inclusive, and is configured of a hexaazatriphenylene derivative shown in the chemical formula 1 or 2. For example, a hole transport layer 16B of the self-luminous element 10B has a thickness of 5 nm to 300 nm both inclusive, and is configured of α-NPD. For example, a light emitting layer 16C of the self-luminous element 10B has a thickness of 10 nm to 100 nm both inclusive, and is configured of spiro 6Φ. For example, an electron transport layer 16D of the self-luminous element 10B has a thickness of 5 nm to 300 nm both inclusive, and is configured of $Alq_3$. For example, an electron injection layer 16E of the self-luminous element 10G has a thickness of about 0.3 nm, and is configured of LiF or $Li_2O$.

For example, the upper electrode 17 has a thickness of about 10 nm, and is configured of an alloy of aluminum (Al), magnesium (Mg), calcium (Ca) or sodium (Na). In particular, an alloy of magnesium and silver (Mg—Ag alloy) is preferable because the alloy has both certain conductivity and small light absorbance in a form of a thin film. While a ratio of magnesium to silver of the Mg—Ag alloy is not particularly limited, the ratio is desirably in a range of Mg:Ag=20:1 to 1:1 in thickness. Alternatively, the material of the upper electrode 17 may be an alloy of aluminum (Al) and lithium (Li) (Al—Li alloy).

The upper electrode 17 further acts as a semi-transmissive reflective layer. Specifically, the self-luminous element 10R has a resonator structure MC1 and thus light generated by the light emitting layer 16C is allowed to resonate between the lower and upper electrodes 14 and 17. The resonator structure MC1 allows the light generated by the light emitting layer 16C to resonate by an interface between the lower electrode 14 and the organic layer 16 as a reflective surface P1, using an interface between the intermediate layer 18 and the electron injection layer 16E as a semi-transmissive reflective surface P2, and the organic layer 16 as a resonator section, and extracts the light from the semi-transmissive reflective surface P2 side. The element 10R has the resonator structure MC1 in this way, causing multiple interference of light generated by the light emitting layer 16C, which decreases half value width of a spectrum of light extracted from the semi-transmissive reflective surface P2 side, and consequently peak intensity of the light may be increased. That is, light radiation intensity may be increased in a front direction, leading to improvement in color purity of emission light. In addition, outside light entering from the second substrate 21 side may be attenuated through such multiple interference, and therefore reflectance of outside light may be extremely reduced in the self-luminous elements 10R, 10G and 10B through a combined effect of the resonator structure and the color filter 23.

To achieve this, an optical distance L1 between the reflective surface P1 and the semi-transmissive reflective surface P2 preferably satisfies numerical expression 9.

$$(2L1)/\lambda + \Phi/(2\pi) = m$$  Numerical expression 9

In the numerical expression 9, L1 represents an optical distance between the reflective surface P1 and the semi-transmissive reflective surface P2, m represents the order (0 or a natural number), Φ represents sum (Φ=Φ1+Φ2) (rad) of phase shift Φ1 of reflected light at the reflective surface P1 and phase shift Φ2 of reflected light at the semi-transmissive reflective surface P2, and λ, represents a peak wavelength of a spectrum of light to be desirably extracted from the semi-transmissive reflective surface P2 side. In the numerical expression 9, L1 and λ, need to be expressed in the same unit, for example, nm.

Positions at which intensity of extracted light is maximized (resonant surfaces) exist between the reflective surface P1 and the semi-transmissive reflective surface P2. The resonant surfaces exist at m+1 places. In a condition of m=1 or more, half-value width of an emission spectrum is largest in the case that a light emitting surface is located in a resonant surface nearest the reflective surface P1.

The self-luminous elements 10R, 10G and 10B may be designed such that the semi-transmissive reflective surface P2 is not provided, and light generated by the light emitting layer 16C is reflected on the reflective surface P1 so as to cause interference between the reflected light and the light generated by the light emitting layer 16C, as shown in FIG. 15

In such a case, the light emitting layer 16C preferably includes a position (interference position) at which the reflected light and the light generated by the light emitting layer 16C intensify each other through interference. The optical distance L1 between the reflective surface P1 and the interference position preferably satisfies numerical expression 10.

$$(2L1)/\lambda + \Phi/(2\pi) = m$$ Numerical expression 10

In the numerical expression 10, L1 represents an optical distance between the reflective surface P1 and the interference position, m represents the order (0 or a natural number), Φ represents phase shift (rad) of reflected light at the reflective surface P1, and λ represents a peak wavelength of a spectrum when light generated by the light emitting layer 16C is emitted from an upper electrode 17 side. In the numerical expression 10, L1 and λ need to be expressed in the same unit, for example, nm.

In self-luminous elements 10R, 10G and 10B having such a resonator structure MC1, or using interference between light generated by the light emitting layer 16C and reflected light on the reflective surface P1, as the order m increases, dependence of luminance or chromaticity on a view angle, namely, difference in luminance or chromaticity between a front view and an oblique view tends to be increased. When an organic EL display device is assumed to be used for a typical television apparatus or the like, reduction in luminance and change in chromaticity depending on view angles are desirably small.

Only in the light of a view angle characteristic, a condition of m=0 is ideal. However, thickness of the organic layer 16 is small in such a condition, which may cause adverse influence on a light emitting characteristic, or cause a short circuit between the lower and upper electrodes 14 and 17. Therefore, for example, a condition of m=1 is used so as to avoid increase in view-angle dependence of luminance or chromaticity and to suppress degradation of a light emitting characteristic or occurrence of a short circuit. For example, in the case that the lower electrode 14 is configured of an aluminum alloy, and the upper electrode 17 is configured of a Mg—Ag alloy, thickness of the organic layer 16 of the blue self-luminous element 10B is about 190 nm in m=1 while the thickness is about 80 nm in m=0, and therefore a short circuit is suppressed in m=1.

Since a resonator effect or an interference effect of the resonator structure MC1 occurs at a different optical condition for each emission color, a view angle characteristic is typically different for each emission color. In a full-color display device, since white or an intermediate color is displayed by mixing colors of monochromatic light, such difference in monochromatic view angle characteristic between emission colors causes disruption of white balance, so that chromaticity of white or an intermediate color is changed depending on view angles.

As described before, the clearance, $\frac{1}{2}(L_{BMG}-L_{ELB})$, of the self-luminous element 10B is different from the clearances, $\frac{1}{2}(L_{BMR}-L_{ELR})$ and $\frac{1}{2}(L_{BMG}-L_{ELG})$, of another self-luminous elements 10R and 10G. Therefore, a level of reduction in luminance due to light blocking of the light blocking film 22 is varied between the colors to reduce difference in view angle characteristic between the colors due to the resonator effect or the interference effect of the resonator structure MC1, so that change in chromaticity of white or an intermediate color depending on view angles may be suppressed.

The display device 1 may be manufactured, for example, in the following way.

First, the pixel drive circuit 140 including the drive transistors Tr1 is formed on the first substrate 11 including the above material, then photosensitive resin is coated over the whole surface of the substrate to form the planarization insulating film 13, and then the planarization insulating film 13 is patterned into a predetermined shape along with formation of the connection holes 13A through exposure and development, and then the patterned film is fired.

Next, the lower electrode 14 including the above material is formed by, for example, a sputtering method, and then the lower electrode 14 is selectively removed by wet etching so that the self-luminous elements 10R, 10G and 10B are separated from one another.

Next, photosensitive resin is coated over the whole surface of the first substrate 11, and then openings are provided in correspondence to emission regions by, for example, a photolithography method, and then the photosensitive resin is fired to form the inter-electrode insulating film 15.

Then, the hole injection layer 16A, the hole transport layer 16B, the light emitting layer 16C and the electron transport layer 16D of the organic layer 16, each layer having the thickness and including the material as described before, are formed by, for example, a vacuum evaporation method.

After the organic layer 16 is formed, the upper electrode 17 having the thickness and including the material as described before is formed by, for example, a vacuum evaporation method. Thus, the self-luminous elements 10R, 10G and 10B as shown in FIG. 14 or 15 are formed.

Next, the protective layer 31 including the above material is formed on the self-luminous elements 10R, 10G and 10B by, for example, a CVD method or a sputtering method.

Moreover, for example, a material of the light blocking film 22 is coated by spin coating or the like on the second substrate 21 including the above material, and then the coated material is patterned by a photolithography technique and fired so that the light blocking film 22 is formed. Next, the red filter 23R, the blue filter 23B, and the green filter 23G are sequentially formed in the same way as in the light blocking film 22.

Then, the adhesion layer 32 is formed on the protective layer 31, and the second substrate 21 is attached to the protective layer via the adhesion layer 32. This is the end of manufacturing the display device 1 as shown in FIGS. 12 to 15.

In the display device 1, a scan signal is supplied from the scan line drive circuit 130 to each pixel 10 via the gate electrode of the write transistor Tr2, and an image signal from the signal line drive circuit 120 is stored into the storage capacitance Cs via the write transistor Tr2. Specifically, on/off control of the drive transistor Tr1 is performed in response to a signal stored in the storage capacitance Cs, so that a drive current Id is injected into the self-luminous elements 10R, 10G and 10B, causing light emission through recombination of holes and electrons. The light is multiply reflected between the lower electrode 14 (reflective surface P1) and the upper electrode 17 (semi-transmissive reflective surface P2), and the multiply-reflected light or light reflected on the lower electrode 14 (reflective surface P1) and light generated by the light emitting layer 16C are intensified by each other through interference, and then the intensified light is extracted through the upper electrode 17, the color filter 23 and the second substrate 21.

In this way, in the embodiment, since the clearance, $\frac{1}{2}(L_{BM}-L_{EL})$, of the self-luminous element 10R (10G or 10B) of at least one emission color is made different from the clearance, $\frac{1}{2}(L_{BM}-L_{EL})$, of the self-luminous element of another emission color, difference in view angle characteristic between the colors is reduced by using reduction in luminance caused by light blocking of the light blocking film 22, and consequently view-angle dependence of chromaticity of white or an intermediate color may be reduced. This is particularly preferable for the case where view angle characteristics of the colors are different from one another, including the case where the resonator structure MC1 is provided so that light generated by the light emitting layer 16C is allowed to resonate between the lower and upper electrodes 14 and 17, or the case where light generated by the light emitting layer 16C is allowed to interfere with reflected light on the lower electrode 14.

Moreover, a contrast ratio may be improved by providing the light blocking film 22.

Furthermore, in the case that width of the emission region 11B of the blue self-luminous element 10B having a short life is increased to extend the life, both of luminance reduction with emission time and luminance reduction caused by light blocking of the light blocking film 22 may be adjusted to be approximately even between all colors, and consequently change in chromaticity of white or an intermediate color depending on view angles may be suppressed.

Modification 1

Figure 16:
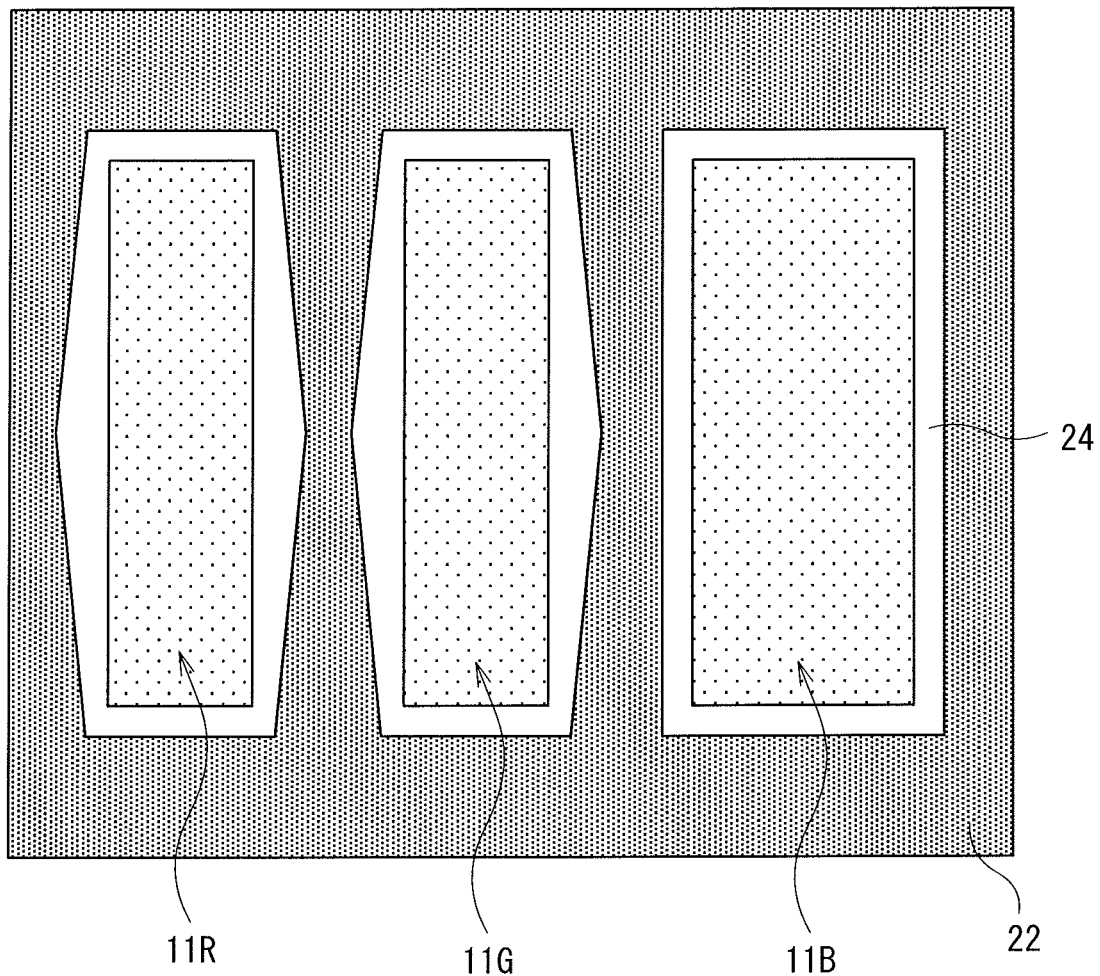
FIG. 16 is a plan view showing a pixel according to modification 1 in an enlarged manner.
Figure 17:
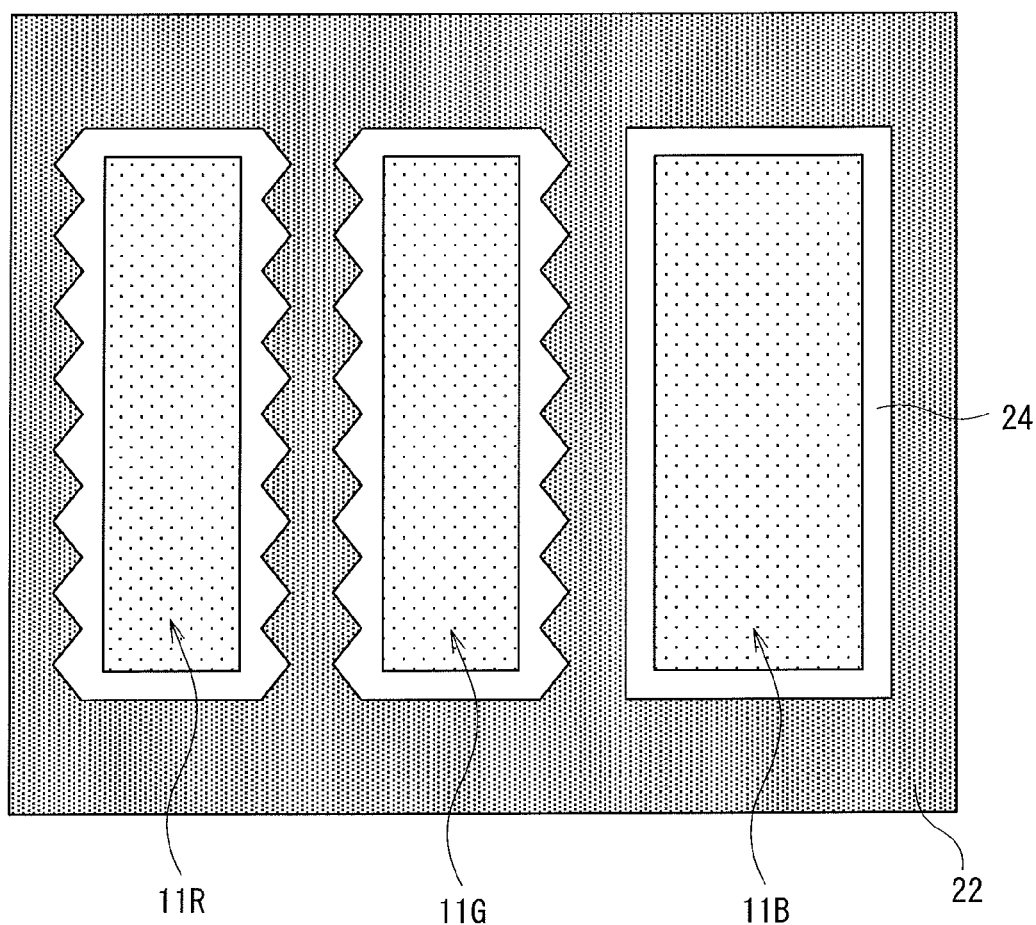
FIG. 17 is a plan view showing a modification of the pixel of FIG. 16.

FIGS. 16 and 17 show planar configurations of a pixel 10 according to modification 1. In the modification, the clearance, $\frac{1}{2}(L_{BM}-L_{EL})$, is continuously changed within one self-luminous element 10R (10G or 10B), thereby a light blocked region Ls is gradually changed depending on view angles so that a view angle characteristic may be finely adjusted. Except for this, the modification 1 has the same configuration, operation and effects as those in the above embodiment, and may be manufactured in the same way as the embodiment.

While description has been made on a case where the clearance, $\frac{1}{2}(L_{BM}-L_{EL})$, in a horizontal direction in a display plane is continuously changed within one self-luminous element 10R (10G or 10B) in the modification 1, a clearance in a vertical direction in a display plane may be continuously changed within one self-luminous element 10R (10G or 10B). Furthermore, both the clearances in the horizontal and vertical directions in a display plane may be continuously changed within one self-luminous element 10R (10G or 10B). However, as shown in FIG. 16 or 17, influence of light blocking of the light blocking film 22 is large in the horizontal direction, in which widths of the emission regions 11R, 11G and 11B are small, and small in the vertical direction in the pixel 10 having the emission regions 11R, 11G and 11B being elongated in the vertical direction in a display plane. Therefore, a sufficient effect is obtained even in the case that only the clearance in the horizontal direction, in which the influence of light blocking is large, is continuously changed within one self-luminous element 10R (10G or 10B).

Module and Application Examples

Next, application examples of the display device described in the embodiment are described. The display device according to the embodiment may be applied to display devices of electronic devices in any field, each of the display devices displaying an externally inputted video signal or an internally generated video signal as an image or a video picture, including a television apparatus, a digital camera, a notebook personal computer, a mobile terminal such as mobile phone, and a video camera.

Module

Figure 18:
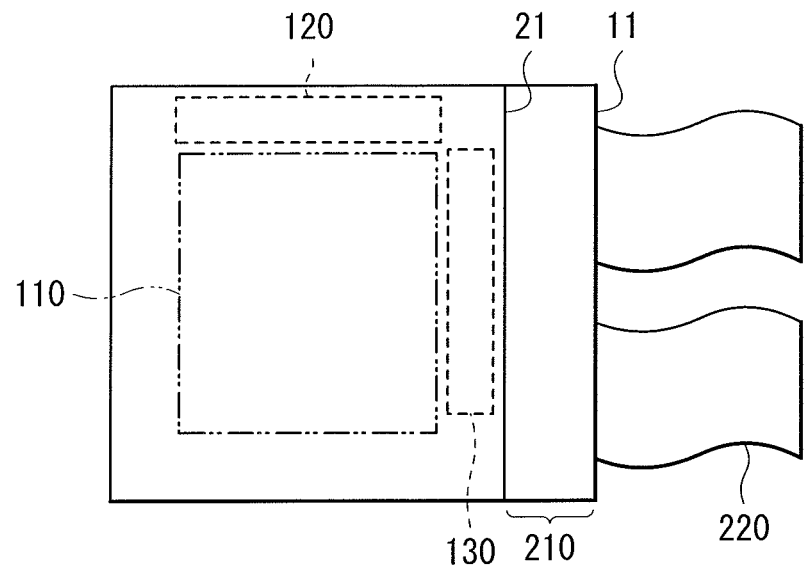
FIG. 18 is a plan view showing a schematic configuration of a module including the display device according to the embodiment.

The display device according to the embodiment may be built in various electronic devices such as application examples 1 to 5 described later, for example, as a module as shown in FIG. 18. For example, the module is formed such that a region 210 exposed from the second substrate 21 and the adhesion layer 32 is provided in one side of the first substrate 11, and external connection terminals (not shown) are formed on the exposed region 210 by extending lines of the signal line drive circuit 120 and the scan line drive circuit 130. The external connection terminals may be provided with a flexible printed circuit (FPC) 220 for input and output of signals.

Application Example 1

Figure 19:
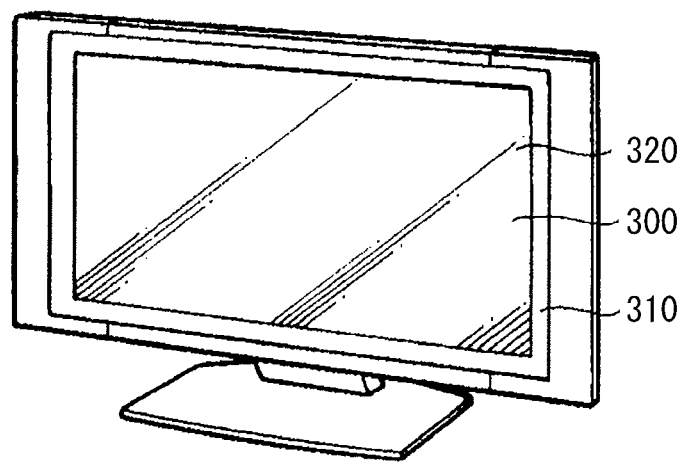
FIG. 19 is a perspective view showing appearance of application example 1 of the display device according to the embodiment.

FIG. 19 shows appearance of a television apparatus using the display device according to the embodiment. The television apparatus has, for example, a front panel 310 and a video display screen 300 including filter glass 320, and the video display screen 300 is configured of the display device according to the embodiment.

Application Example 2

Figure 20A:
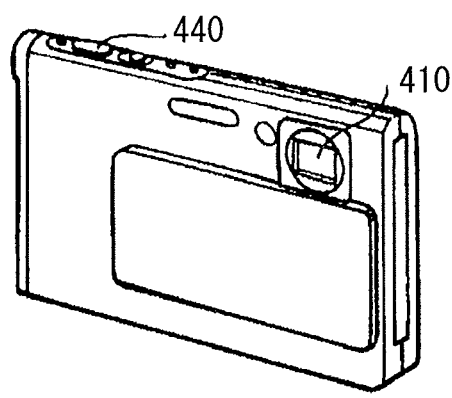
FIGS. 20A and 20B are perspective views, where
Figure 20B:
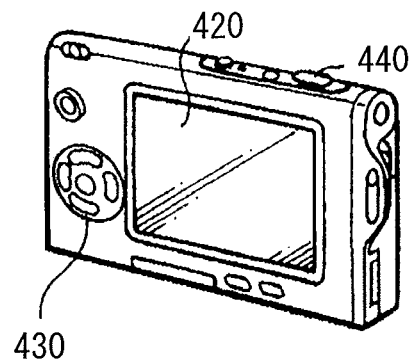

FIGS. 20A and 20B show appearance of a digital camera using the display device according to the embodiment. The digital camera has, for example, a light emitting section for flash 410, a display 420, a menu switch 430 and a shutter button 440, and the display 420 is configured of the display device according to the embodiment Application Example 3

Figure 21:
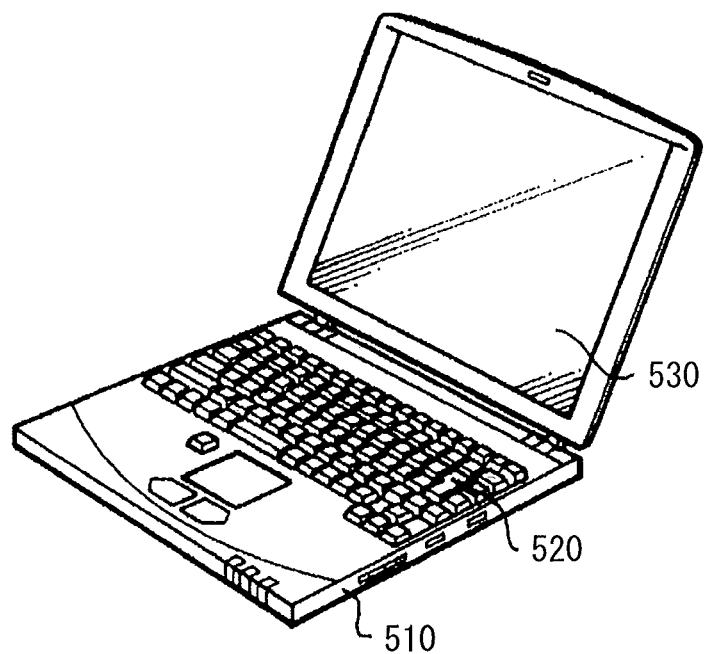
FIG. 21 is a perspective view showing appearance of application example 3.

FIG. 21 shows appearance of a notebook personal computer using the display device according to the embodiment. The notebook personal computer has, for example, a body 510, a keyboard 520 for input operation of letters and the like, and a display 530 for displaying images, and the display 530 is configured of the display device according to the embodiment.

Application Example 4

Figure 22:
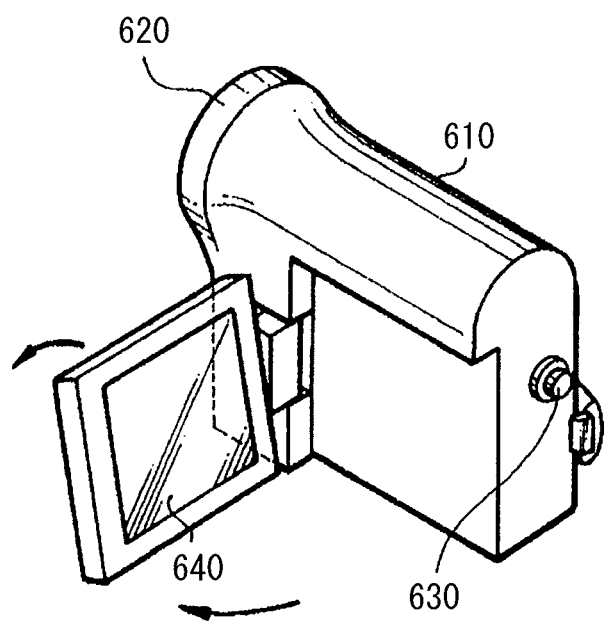
FIG. 22 is a perspective view showing appearance of application example 4.

FIG. 22 shows appearance of a video camera using the display device according to the embodiment. The video camera has, for example, a body 610, a lens 620 for shooting an object provided on a front side-face of the body 610, and a start/stop switch 630 used in shooting, and a display 640. The display 640 is configured of the display device according to the embodiment.

Application Example 5

FIGS. 23A to 23G show appearance of a mobile phone using the display device according to the embodiment. For example, the mobile phone is formed by connecting an upper housing 710 to a lower housing 720 by a hinge 730, and has a display 740, a sub display 750, a picture light 760, and a camera 770. The display 740 or the sub display 750 is configured of the display device according to the embodiment.

While the application has been described with the embodiment, the application is not limited to the embodiment, and may be variously modified or altered. For example, the material and the thickness of each layer, or the deposition method and the deposition condition thereof described in the embodiment are not limitative, and other materials and other thickness, or other deposition methods and other deposition conditions may be used.

Moreover, while description has been made with the specific configuration of the self-luminous elements 10R, 10G and 10B in the embodiment, not all layers in the configuration need not to be provided, or another layer may be additionally provided.

Furthermore, while description has been made on the case of an active-matrix display device in the embodiment, the application may be applied to a passive-matrix display device. In addition, a configuration of a pixel drive circuit for active matrix drive is not limited to the configuration described in the embodiment, and may be added with a capacitance element or a transistor as necessary. In such a case, a drive circuit to be necessary may be added in addition to the signal line drive circuit 120 and the scan line drive circuit 130 in accordance with modification of the pixel drive circuit.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
a pair of opposed substrates;
a plurality of openings; and
a plurality of self-luminous elements, each of the self-luminous elements having an emission region associated with each of the openings, and having an emission color different from an emission color of another element, at least one self-luminous element being different from other self-luminous elements in clearance in a display plane direction from an end of the emission region to an edge of the opening, such that a first pixel includes a first clearance having a first distance and a second clearance having a second distance, the first clearance and the second clearance being on opposite sides of the first pixel, a second pixel includes a third clearance having a third distance and a fourth clearance having a fourth distance, the third clearance and the fourth clearance being on opposite sides of the second pixel, wherein the third distance is different from both of the first distance and the second distance.

2. The display device according to claim 1, wherein a dimension in a vertical direction in a display plane of the emission region is larger than a dimension in a horizontal direction in the display plane of the emission region, and the first clearance, the second clearance, the third clearance, and the fourth clearance are in the horizontal direction in the display plane.

3. The display device according to claim 2, wherein the one self-luminous element is large in the dimension in the horizontal direction in the display plane of the emission region, and small in the clearance compared with the self-luminous elements other than the one self-luminous element such that the third distance and the fourth distance are both smaller than the first distance and the second distance.

4. The display device according to claim 1, wherein the clearance is continuously changed within the one self-luminous element.

5. The display device according to claim 1, wherein color filters are provided in openings of a light blocking layer, respectively.

6. The display device according to claim 1, wherein the fourth distance is equal to the third distance.

7. The display device according to claim 1, wherein the fourth distance is different from both of the first distance and the second distance.

* * * * *